United States Patent
Kato et al.

(10) Patent No.: US 9,332,644 B2
(45) Date of Patent: May 3, 2016

(54) HIGH-FREQUENCY TRANSMISSION LINE AND ELECTRONIC DEVICE

(71) Applicant: Murata Manufacturing Co., Ltd., Nagaokakyo-shi, Kyoto-fu (JP)

(72) Inventors: Noboru Kato, Nagaokakyo (JP); Masahiro Ozawa, Nagaokakyo (JP)

(73) Assignee: Murato Manufacturing Co., Ltd., Kyoto (JP)

( * ) Notice: Subject to any disclaimer, the term of this patent is extended or adjusted under 35 U.S.C. 154(b) by 179 days.

(21) Appl. No.: 14/305,127

(22) Filed: Jun. 16, 2014

(65) Prior Publication Data

US 2014/0292449 A1    Oct. 2, 2014

Related U.S. Application Data

(63) Continuation of application No. PCT/JP2012/083970, filed on Dec. 27, 2012.

(30) Foreign Application Priority Data

Jan. 6, 2012  (JP) ................ 2012-000988

(51) Int. Cl.
*H01P 3/08* (2006.01)
*H05K 1/14* (2006.01)
(Continued)

(52) U.S. Cl.
CPC  *H05K 1/144* (2013.01); *H01P 3/08* (2013.01); *H01P 3/085* (2013.01); *H05K 1/0225* (2013.01);
(Continued)

(58) Field of Classification Search
CPC .................................. H01P 3/08; H03H 7/38
USPC ..................... 333/1, 4, 5, 238, 246
See application file for complete search history.

(56) References Cited

U.S. PATENT DOCUMENTS 6,522,214 B1    2/2003   Harju et al.

FOREIGN PATENT DOCUMENTS

| EP | 2 456 005 A1 | 5/2012 |
|----|--------------|--------|
| JP | 6-244058 A   | 9/1994 |

(Continued)

OTHER PUBLICATIONS

Official Communication issued in corresponding Chinese Patent Application No. 201280063288.6, mailed on Apr. 27, 2015.

(Continued)

*Primary Examiner* — Stephen E Jones
(74) *Attorney, Agent, or Firm* — Keating & Bennett, LLP

(57) ABSTRACT

A high-frequency transmission line includes a laminate including dielectric layers, a first signal line provided in the laminate, a second signal line provided in the laminate and positioned on a first side in a direction of lamination relative to the first signal line, so as to cross the first signal line when viewed in a plan view in the direction of lamination, a first ground conductor positioned on a second side in the direction of lamination relative to the first signal line, a second ground conductor positioned on the first side in the direction of lamination relative to the second signal line, and an intermediate ground conductor provided between the first and second signal lines in the direction of lamination, so as to overlap with crossing portions of the first and second lines when viewed in a plan view in the direction of lamination. An area of overlap of the first ground conductor with the first signal line is smaller than an area of overlap of the second ground conductor with the first signal line. An area of overlap of the second ground conductor with the second signal line is smaller than an area of overlap of the first ground conductor with the second signal line.

18 Claims, 15 Drawing Sheets

| (51) | Int. Cl. | |
|---|---|---|
| | H05K 1/02 | (2006.01) |
| | H05K 1/03 | (2006.01) |
| | H05K 1/11 | (2006.01) |
| | H05K 7/14 | (2006.01) |

(52) U.S. Cl.
CPC ............ *H05K 1/0298* (2013.01); *H05K 1/0393* (2013.01); *H05K 1/11* (2013.01); *H05K 7/1427* (2013.01); *H05K 2201/0195* (2013.01); *H05K 2201/041* (2013.01)

(56) References Cited

FOREIGN PATENT DOCUMENTS

| JP | 2002-368507 A | 12/2002 |
| JP | 2003-502973 A | 1/2003 |
| JP | 2011-071403 A | 4/2011 |
| JP | 2011-160231 A | 8/2011 |
| WO | 2011/007660 A1 | 1/2011 |

OTHER PUBLICATIONS

Official Communication issued in International Patent Application No. PCT/JP2012/083970, mailed on Apr. 2, 2013.

F I G . 7
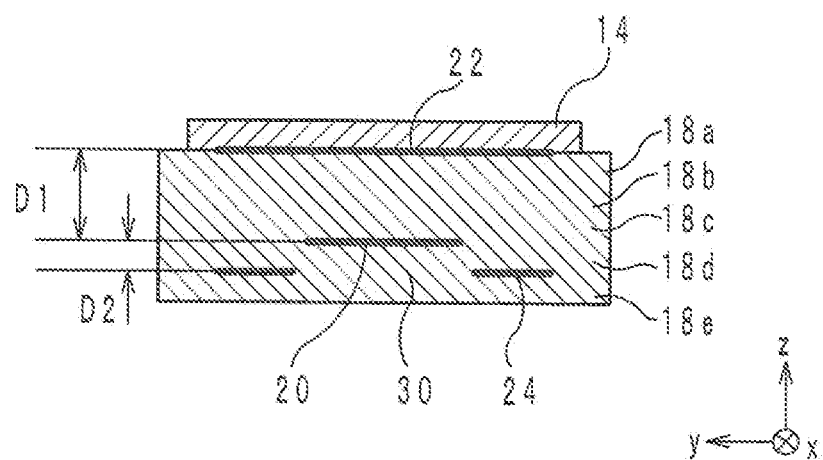
F I G . 8
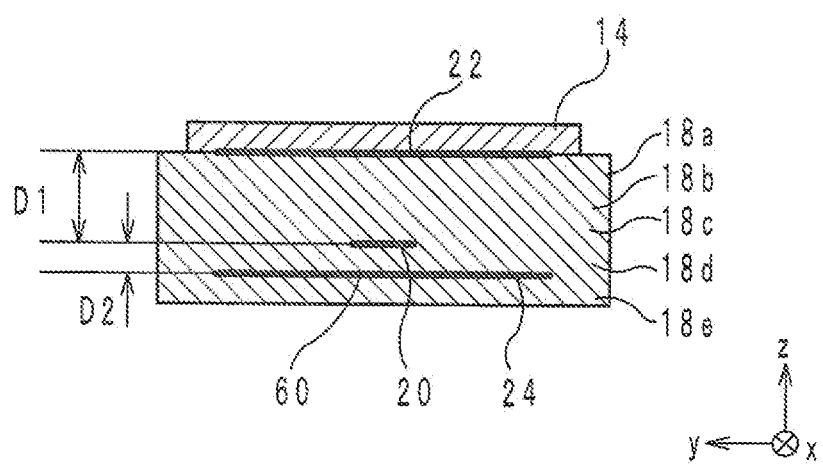

F I G. 1 1
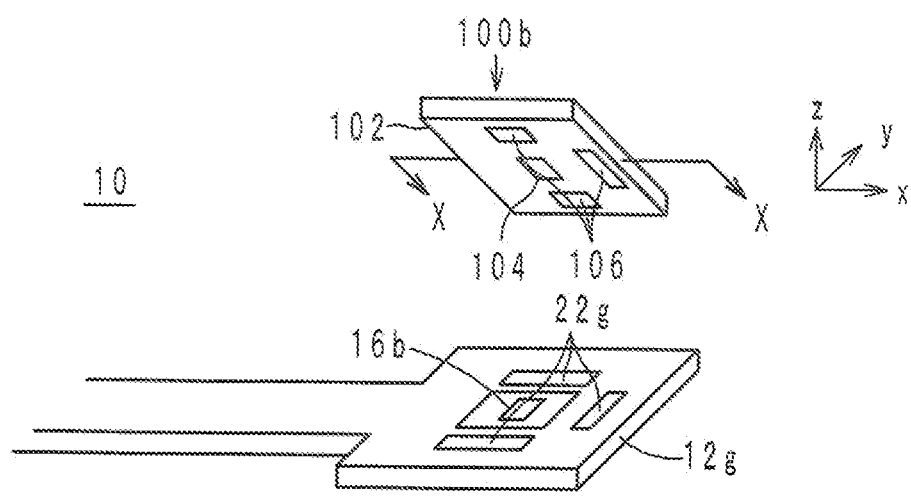
F I G. 1 2
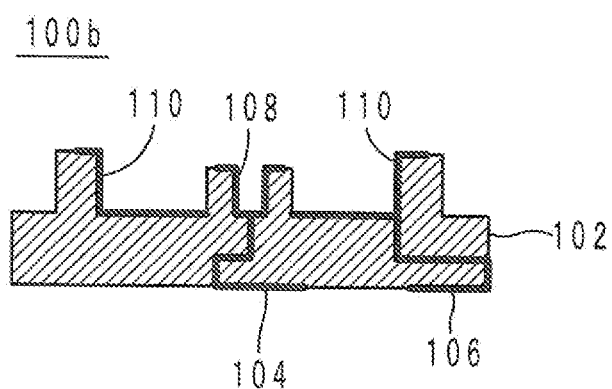

F I G . 1 3
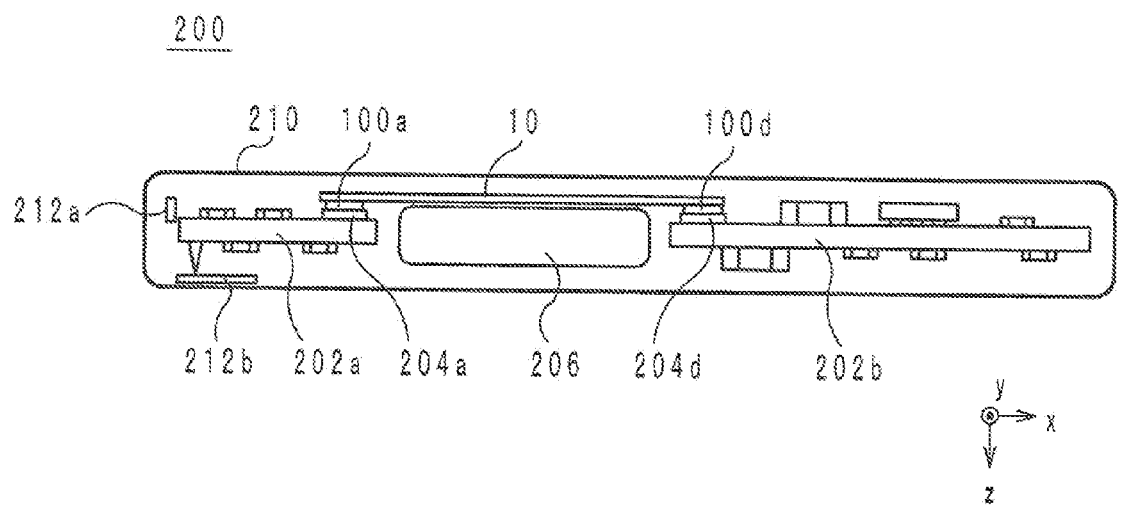
F I G . 1 4
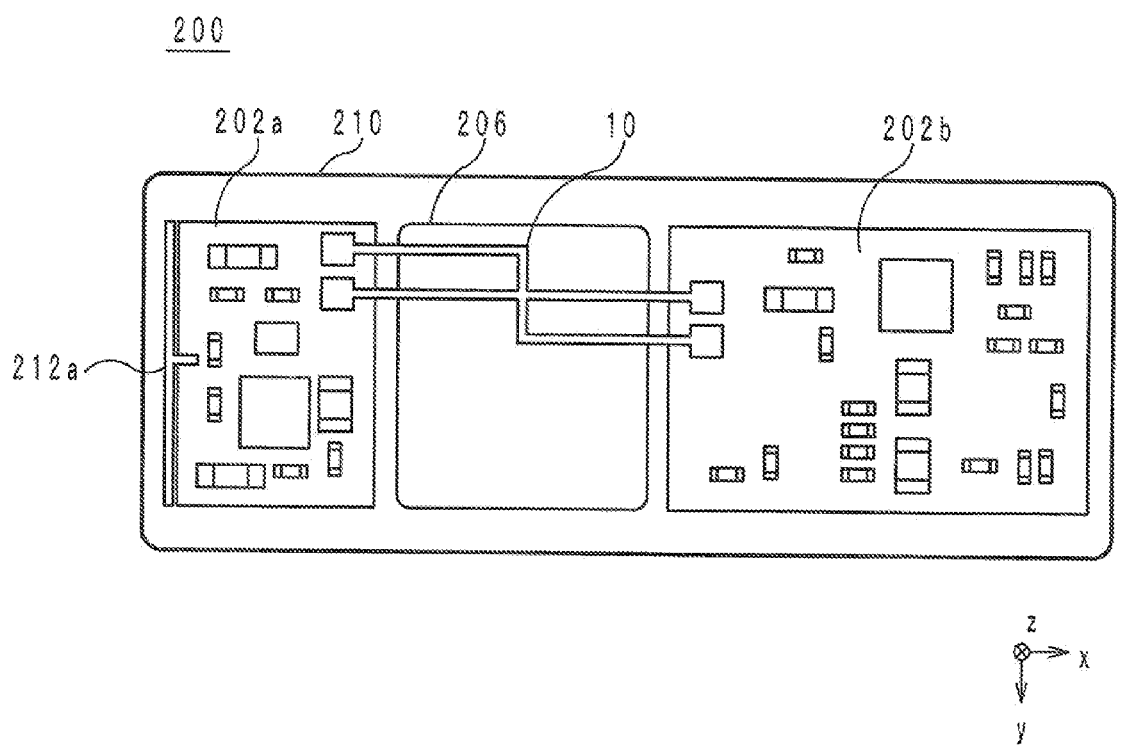

F I G . 16
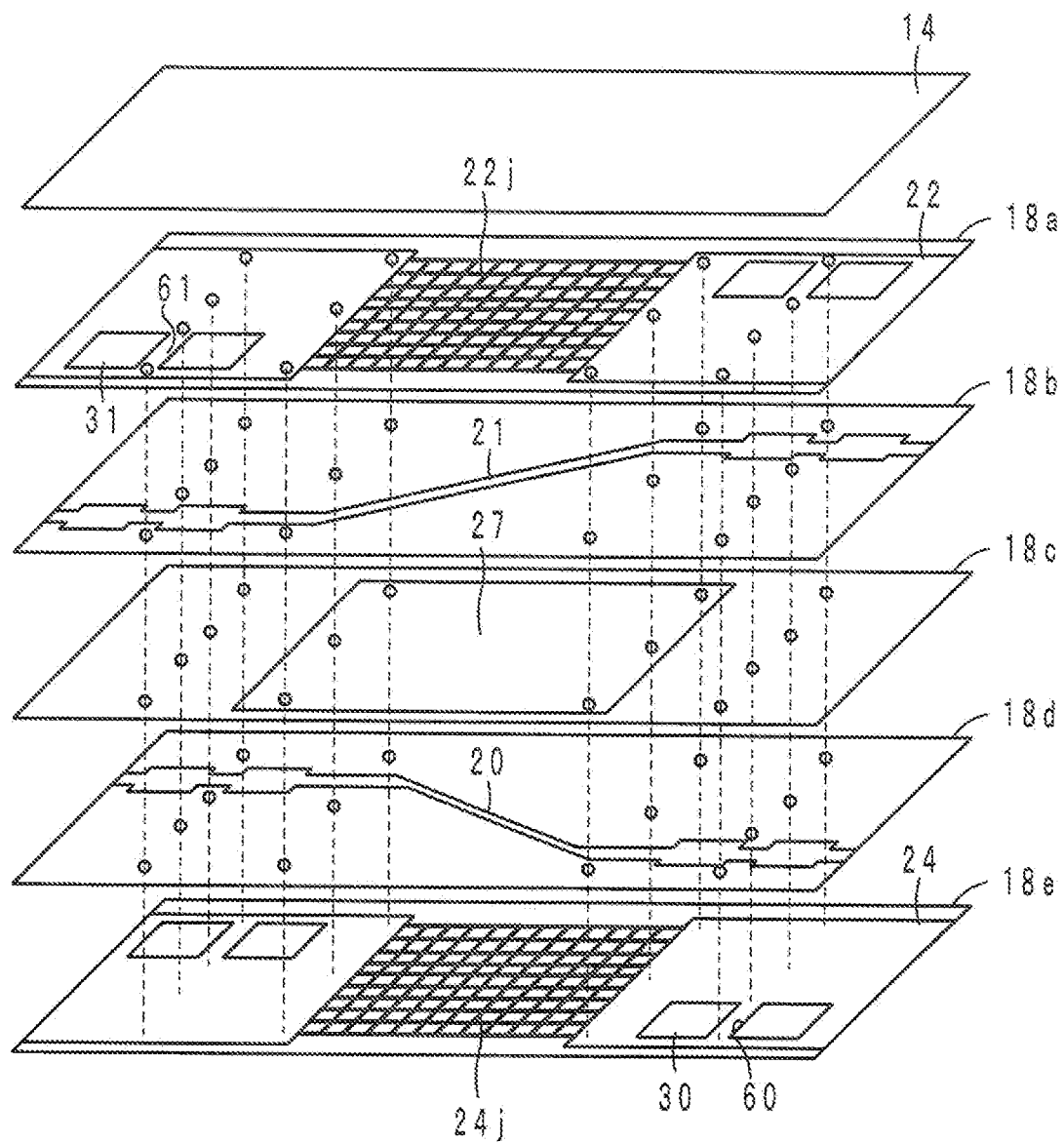

HIGH-FREQUENCY TRANSMISSION LINE AND ELECTRONIC DEVICE

This application is based on Japanese Patent Application No. 2012-000988 filed on Jan. 6, 2012, and International Application No. PCT/JP2012/083970 filed on Dec. 27, 2012, the entire contents of each of which is incorporated herein by reference.

BACKGROUND OF THE INVENTION

1. Field of the Invention

The present invention relates to high-frequency transmission lines and electronic devices, and more particularly to a high-frequency transmission line for use in high-frequency signal transmission and an electronic device including the same.

2. Description of Related Art

As inventions relevant to conventional high-frequency transmission lines, signal lines described in, for example, International Patent Publication WO 2011/007660 and Japanese Patent Laid-Open Publication No. 2011-71403 are known. Each of these signal lines includes a laminate, a signal line, and two ground conductors.

The laminate is formed by laminating a plurality of flexible insulator layers. The signal line is provided in the laminate. The signal line is positioned between the two ground conductors in the direction of lamination. Accordingly, the signal line and the two ground conductors form a stripline structure. The above signal lines described in International Patent Publication WO 2011/007660 and Japanese Patent Laid-Open Publication No. 2011-71403 are formed by laminates, and therefore, are thinner than the diameter of a typical coaxial cable. Accordingly, they can be disposed in a narrow space within an electronic device.

Incidentally, in some cases, it is desired to cross two signal lines such as those described in International Patent Publication WO 2011/007660 and Japanese Patent Laid-Open Publication No. 2011-71403. However, crossing two signal lines results in two laminates overlapping at a crossing of the two signal lines, which results in an increased thickness at the crossing. On the other hand, it is conceivable to provide two signal lines in a single laminate, so as to cross each other within the laminate. This results in a reduced thickness at a crossing of two signal lines in a laminate, but crosstalk occurs between the signal lines because the signal lines are opposed to each other.

SUMMARY OF THE INVENTION

A high-frequency transmission line according to a preferred embodiment of the present invention includes a laminate including a plurality of dielectric layers, a first signal line provided in the laminate, a second signal line provided in the laminate and positioned on a first side in a direction of lamination relative to the first signal line, so as to cross the first signal line when viewed in a plan view in the direction of lamination, a first ground conductor positioned on a second side in the direction of lamination relative to the first signal line, a second ground conductor positioned on the first side in the direction of lamination relative to the second signal line, and an intermediate ground conductor provided between the first and second signal lines in the direction of lamination, so as to overlap with crossing portions of the first and second lines when viewed in a plan view in the direction of lamination. An area of overlap of the first ground conductor with the first signal line is smaller than an area of overlap of the second ground conductor with the first signal line. An area of overlap of the second ground conductor with the second signal line is smaller than an area of overlap of the first ground conductor with the second signal line.

An electronic device according to another preferred embodiment of the present invention includes a housing and a high-frequency transmission line disposed in the housing. The high-frequency transmission line includes a laminate including a plurality of dielectric layers, a first signal line provided in the laminate, a second signal line provided in the laminate and positioned on a first side in a direction of lamination relative to the first signal line, so as to cross the first signal line when viewed in a plan view in the direction of lamination, a first ground conductor positioned on a second side in the direction of lamination relative to the first signal line, a second ground conductor positioned on the first side in the direction of lamination relative to the second signal line, and an intermediate ground conductor provided between the first and second signal lines in the direction of lamination, so as to overlap with crossing portions of the first and second lines when viewed in a plan view in the direction of lamination. An area of overlap of the first ground conductor with the first signal line is smaller than an area of overlap of the second ground conductor with the first signal line. An area of overlap of the second ground conductor with the second signal line is smaller than an area of overlap of the first ground conductor with the second signal line.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a cross-sectional structure view of a section A1 of the high-frequency transmission line according to a preferred embodiment of the present invention.

FIG. 8 is a cross-sectional structure view of a section A2 of the high-frequency transmission line according to a preferred embodiment of the present invention.

FIG. 11 is an external oblique view of a connector in the high-frequency transmission line.

FIG. 12 is a cross-sectional structure view of the connector in the high-frequency transmission line.

FIG. 13 illustrates an electronic device provided with the high-frequency transmission line as viewed in a plan view in the y-axis direction.

FIG. 14 illustrates the electronic device provided with the high-frequency transmission line as viewed in a plan view in the z-axis direction.

FIG. 16 is an exploded oblique view of a section of the high-frequency transmission line according to the first modification of a preferred embodiment of the present invention.

DETAILED DESCRIPTION OF THE PREFERRED EMBODIMENTS

Hereinafter, a high-frequency transmission line according to preferred embodiments of the present invention, along with an electronic device including the high-frequency transmission line, will be described with reference to the drawings.

Figure 1:
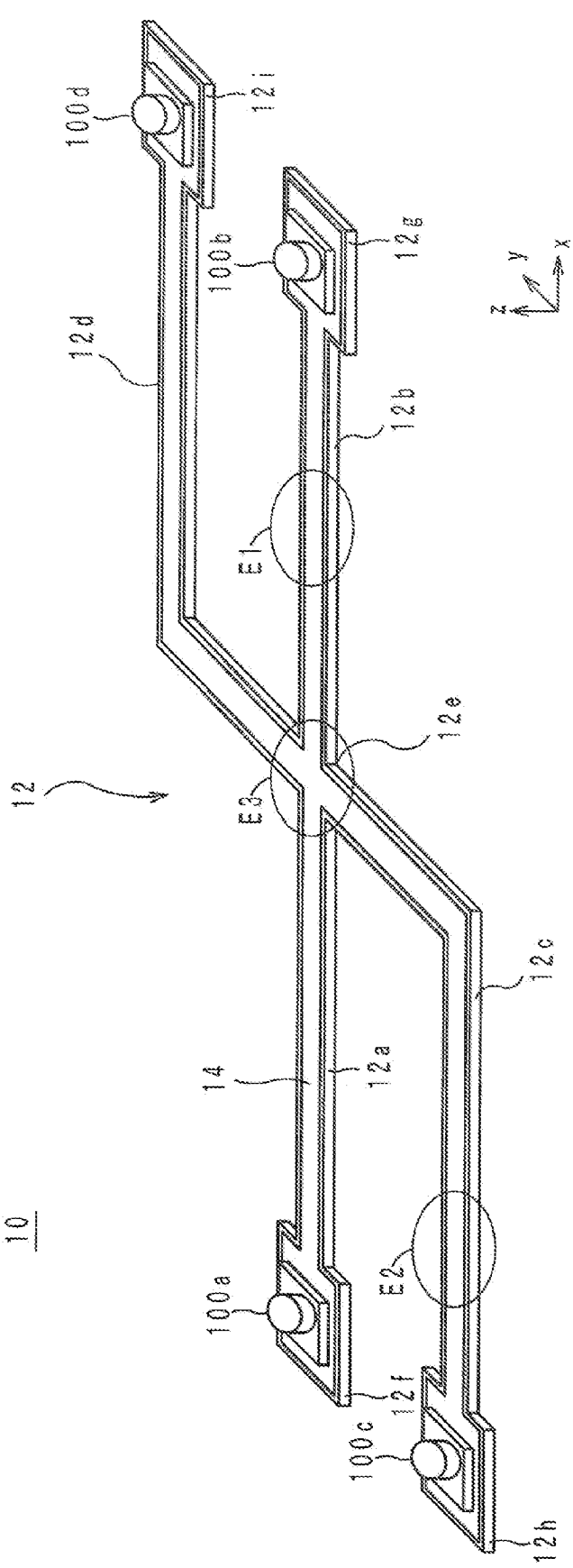
FIG. 1 is an external oblique view of a high-frequency transmission line according to a preferred embodiment of the present invention.
Figure 2:
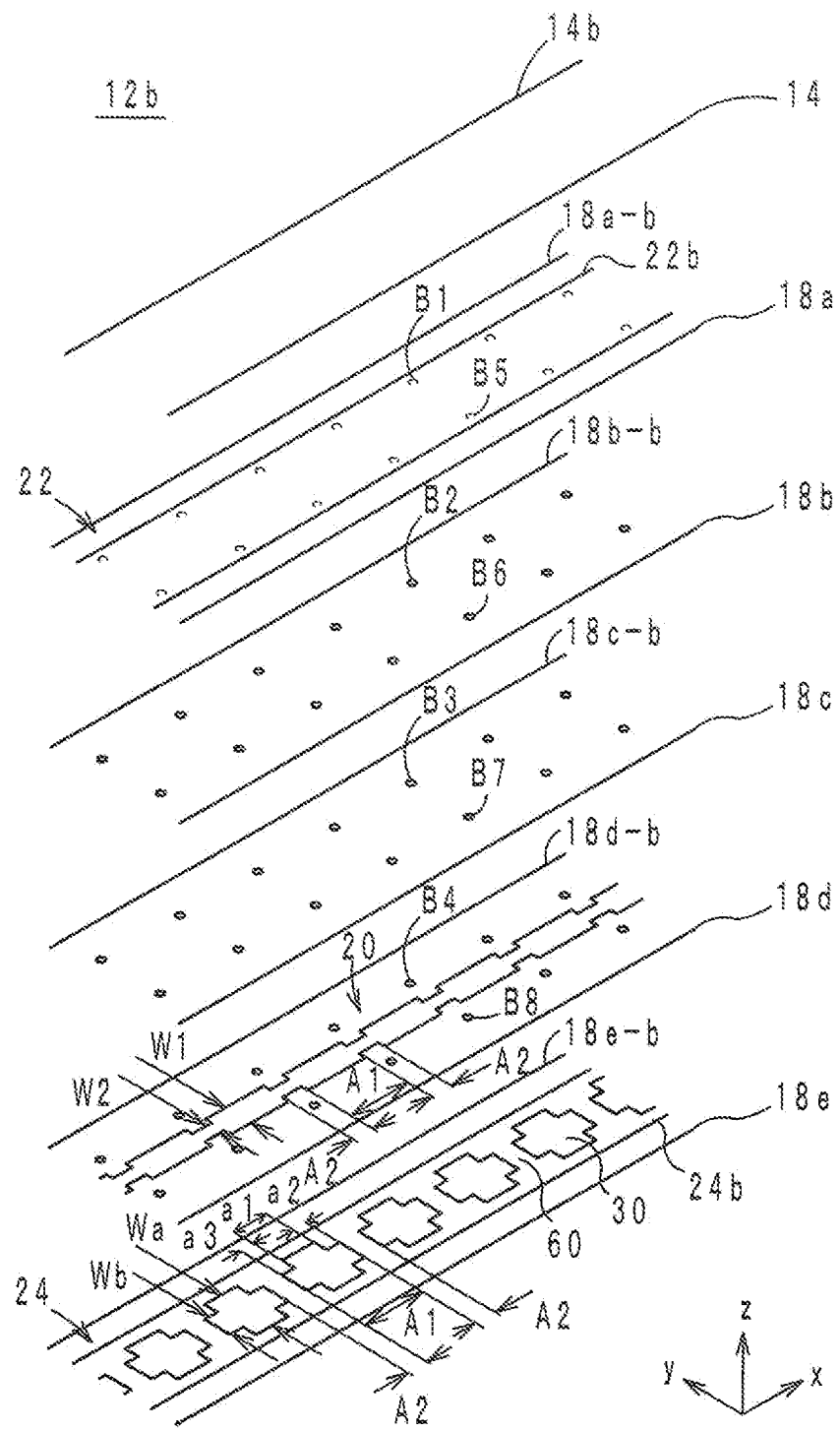
FIG. 2 is an exploded oblique view of a portion E1 of the high-frequency transmission line according to a preferred embodiment of the present invention.
Figure 3:
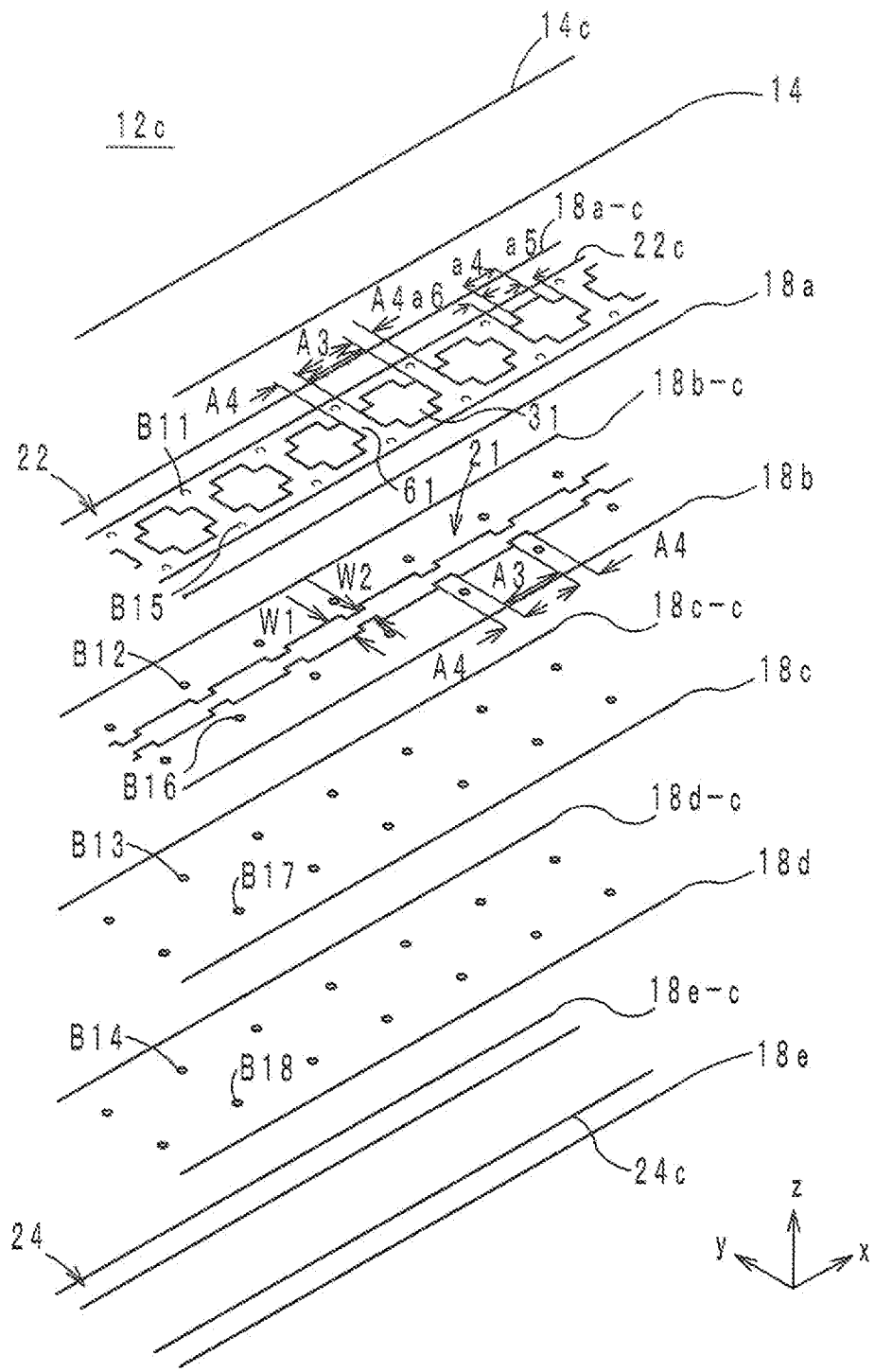
FIG. 3 is an exploded oblique view of a portion E2 of the high-frequency transmission line according to a preferred embodiment of the present invention.
Figure 4:
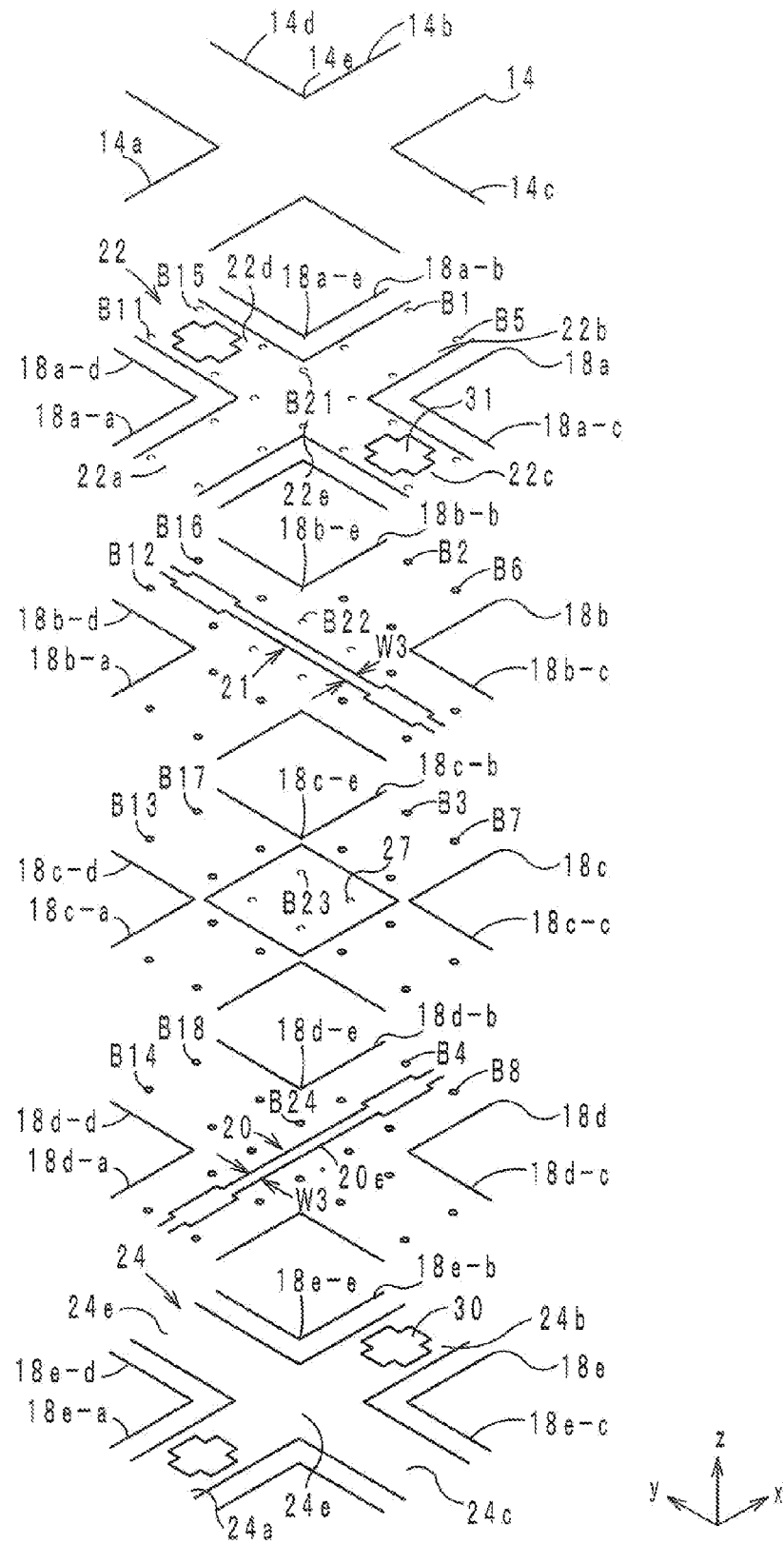
FIG. 4 is an exploded oblique view of a portion E3 of the high-frequency transmission line according to a preferred embodiment of the present invention.
Figure 5:
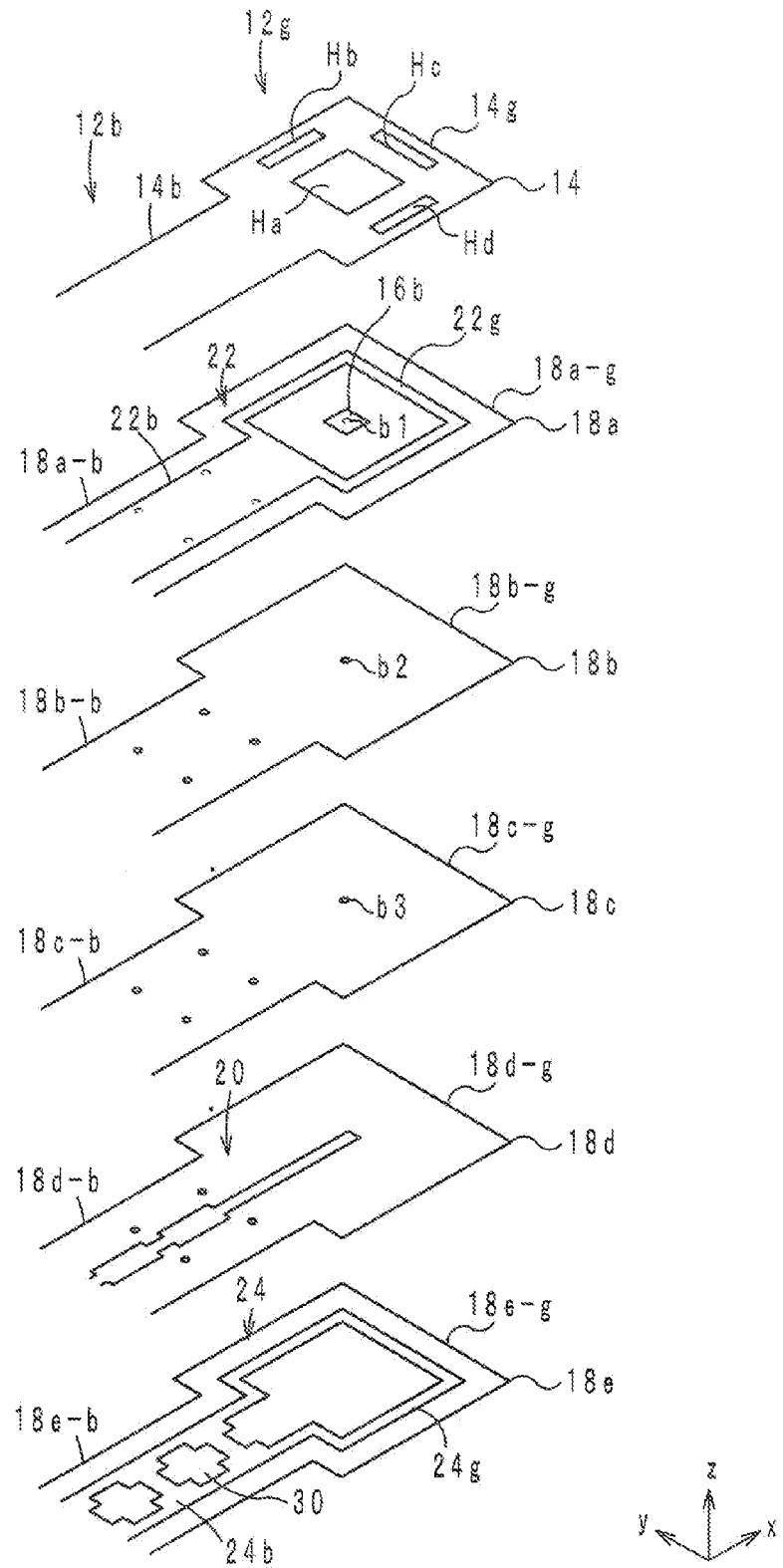
FIG. 5 is an exploded oblique view of a connecting portion of the high-frequency transmission line according to a preferred embodiment of the present invention.
Figure 6:
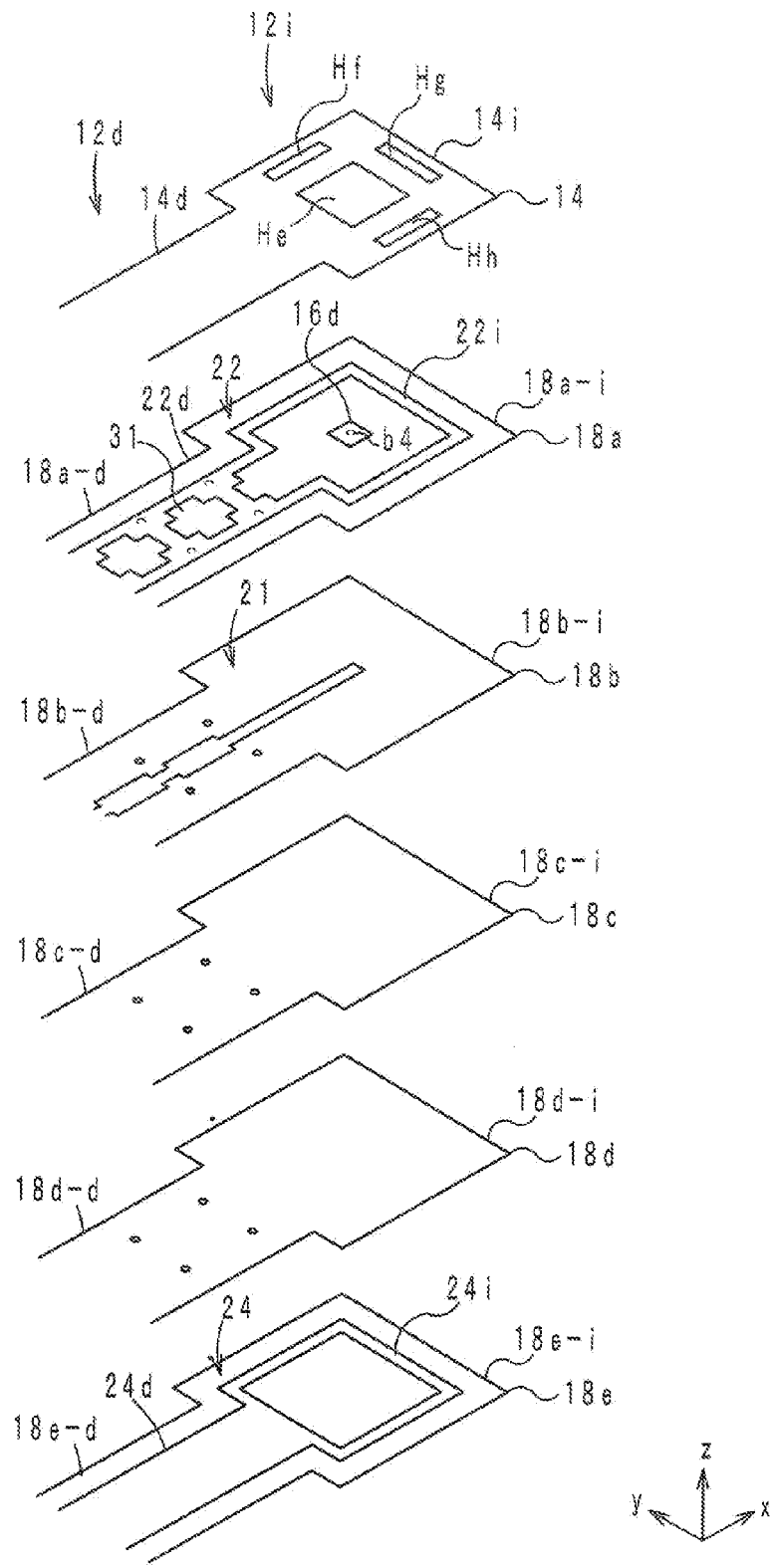
FIG. 6 is an exploded oblique view of another connecting portion of the high-frequency transmission line according to a preferred embodiment of the present invention.
Figure 9:
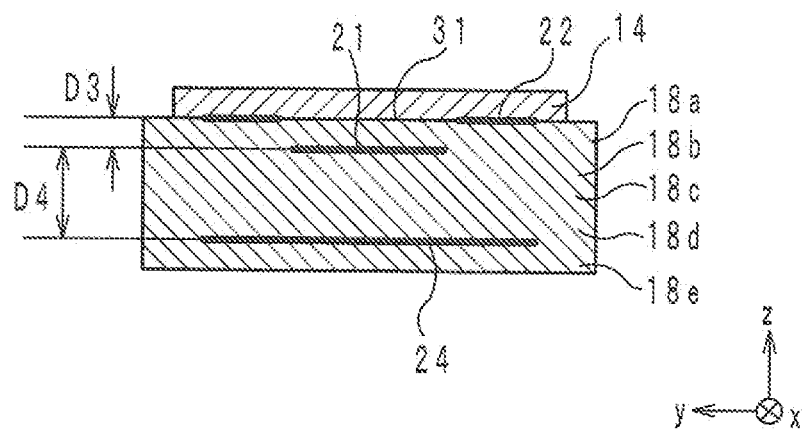
FIG. 9 is a cross-sectional structure view of a section A3 of the high-frequency transmission line according to a preferred embodiment.
Figure 10:
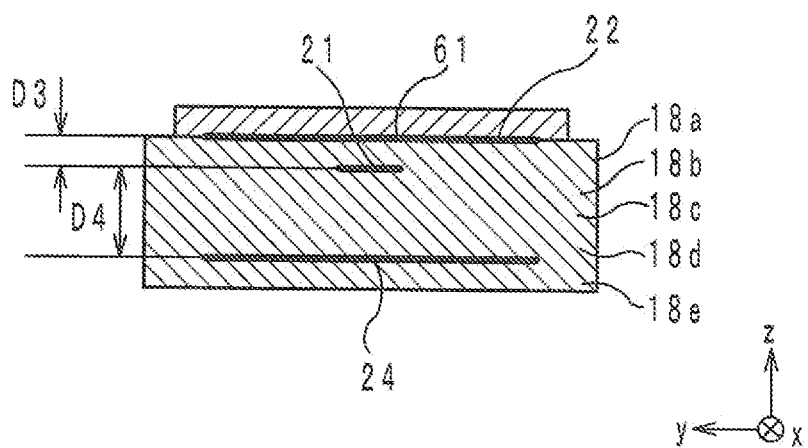
FIG. 10 is a cross-sectional structure view of a section A4 of the high-frequency transmission line according to a preferred embodiment of the present invention.

The configuration of the high-frequency transmission line according to the present preferred embodiment of the present invention will be described below with reference to the drawings. FIG. 1 is an external oblique view of the high-frequency transmission line 10 according to the present preferred embodiment. FIG. 2 is an exploded oblique view of a portion E1 of the high-frequency transmission line 10 according to the present preferred embodiment. FIG. 3 is an exploded oblique view of a portion E2 of the high-frequency transmission line 10 according to the present preferred embodiment. FIG. 4 is an exploded oblique view of a portion E3 of the high-frequency transmission line 10 according to the present preferred embodiment. FIG. 5 is an exploded oblique view of a connecting portion 12g of the high-frequency transmission line 10 according to the present preferred embodiment. FIG. 6 is an exploded oblique view of a connecting portion 12i of the high-frequency transmission line 10 according to the present preferred embodiment. FIG. 7 is a cross-sectional structure view of a section A1 of the high-frequency transmission line 10 according to the present preferred embodiment. FIG. 8 is a cross-sectional structure view of a section A2 of the high-frequency transmission line 10 according to the present preferred embodiment. FIG. 9 is a cross-sectional structure view of a section A3 of the high-frequency transmission line 10 according to the present preferred embodiment. FIG. 10 is a cross-sectional structure view of a section A4 of the high-frequency transmission line 10 according to the present preferred embodiment. In the following, the direction of lamination of the high-frequency transmission line 10 will be defined as a z-axis direction, for example. Moreover, the longitudinal direction of the high-frequency transmission line 10 will be defined as an x-axis direction, and the direction perpendicular to the x-axis and z-axis directions will be defined as a y-axis direction, for example.

As shown in FIGS. 1 through 6, the high-frequency transmission line 10 preferably includes a dielectric element assembly 12, external terminals 16a to 16d (only the external terminals 16b and 16d are shown in the figures), signal lines 20 and 21, ground conductors 22 and 24, an intermediate ground conductor 27, connectors 100a to 100d, and via-hole conductors b1 to b4, B1 to B8, B11 to B18, and B21 to B24.

The dielectric element assembly 12 includes line portions 12a to 12d, a crossing portion 12e, and connecting portions 12f to 12i. The dielectric element assembly 12 is a flexible laminate preferably formed by laminating a protective layer 14 and dielectric sheets (dielectric layers) 18a to 18e in this order, from the positive side to the negative side in the z-axis direction, as shown in FIG. 2. In the following description, the principal surface of the dielectric element assembly 12 that is located on the positive side in the z-axis direction will be referred to as a top surface, and the principal surface of the dielectric element assembly 12 that is located on the negative side in the z-axis direction will be referred to as a bottom surface.

The crossing portion 12e is positioned near the center of the dielectric element assembly 12 both in the x-axis direction and in the y-axis direction. The line portion 12a extends from the crossing portion 12e towards the negative side in the x-axis direction. The line portion 12b extends from the crossing portion 12e towards the positive side in the x-axis direction. The line portion 12c extends from the crossing portion 12e towards the negative side in the y-axis direction, and bends to the negative side in the x-axis direction. The line portion 12d extends from the crossing portion 12e toward the positive side in the y-axis direction, and bends to the positive side in the x-axis direction.

The connecting portion 12f preferably has a rectangular or substantially rectangular shape connected to the end of the line portion 12a that is located on the negative side in the x-axis direction. The connecting portion 12g preferably has a rectangular or substantially rectangular shape connected to the end of the line portion 12b that is located on the positive side in the x-axis direction. The connecting portion 12h preferably has a rectangular or substantially rectangular shape connected to the end of the line portion 12c that is located on the negative side in the x-axis direction. The connecting portion 12i preferably has a rectangular or substantially rectangular shape connected to the end of the line portion 12d that is located on the positive side in the x-axis direction.

The dielectric sheets 18a to 18e, when viewed in a plan view in the z-axis direction, preferably have the same or substantially the same shape as the dielectric element assembly 12. The dielectric sheets 18a to 18e are preferably made of a flexible thermoplastic resin, such as liquid crystal polymer or polyimide, for example. Each of the dielectric sheets 18a to 18e preferably has a thickness of, for example, about 25 µm to about 100 µm after lamination, for example. In the following, the principal surface of each of the dielectric sheets 18a to 18e that is located on the positive side in the z-axis direction will be referred to as a top surface, and the principal surface of each of the dielectric sheets 18a to 18e that is located on the negative side in the z-axis direction will be referred to as a bottom surface.

Furthermore, the dielectric sheet 18a includes line portions 18a-a, 18a-b, 18a-c, and 18a-d, a crossing portion 18a-e, and connecting portions 18a-f, 18a-g, 18a-h, and 18a-i. The dielectric sheet 18b includes line portions 18b-a, 18b-b, 18b-c, and 18b-d, a crossing portion 18b-e, and connecting portions 18b-f, 18b-g, 18b-h, and 18b-i. The dielectric sheet 18c includes line portions 18c-a, 18c-b, 18c-c, and 18c-d, a crossing portion 18c-e, and connecting portions 18c-f, 18c-g, 18c- h, and 18c-i. The dielectric sheet 18d includes line portions 18d-a, 18d-b, 18d-c, and 18d-d, a crossing portion 18d-e, and connecting portions 18d-f, 18d-g, 18d-h, and 18d-i. The dielectric sheet 18e includes line portions 18e-a, 18e-b, 18e-c, and 18e-d, a crossing portion 18e-e, and connecting portions 18e-f, 18e-g, 18e-h, and 18e-i.

The line portion 12a includes line portions 18a-a, 18b-a, 18c-a, 18d-a, and 18e-a. The line portion 12b includes line portions 18a-b, 18b-b, 18c-b, 18d-b, and 18e-b. The line portion 12c includes line portions 18a-c, 18b-c, 18c-c, 18d-c, and 18e-c. The line portion 12d includes line portions 18a-d, 18b-d, 18c-d, 18d-d, and 18e-d. The crossing portion 12e includes crossing portions 18a-e, 18b-e, 18c-e, 18d-e, and 18e-e. The connecting portion 12f includes connecting portions 18a-f, 18b-f, 18c-f, 18d-f, and 18e-f. The connecting portion 12g includes connecting portions 18a-g, 18b-g, 18c-g, 18d-g, and 18e-g. The connecting portion 12h includes connecting portions 18a-h, 18b-h, 18c-h, 18d-h, and 18e-h. The connecting portion 12i includes connecting portions 18a-i, 18b-i, 18c-i, 18d-i, and 18e-i.

The signal line 20 (first signal line) is a linear conductor provided in the dielectric element assembly 12, and more specifically, as shown in FIGS. 2, 4, and 5, the signal line 20 extends on the top surface of the dielectric sheet 18d, along the line portions 18d-a and 18d-b, the crossing portion 18d-e, and the connecting portions 18d-f and 18d-g (which is not shown in the figures). The signal line 20 is positioned approximately at the center in the width direction of each of the line portions 18d-a and 18d-b, the crossing portion 18d-e, and the connecting portions 18d-f and 18d-g. In addition, the end of the signal line 20 on the positive side in the x-axis direction is positioned approximately at the center of the connecting portion 18d-g (not shown). The end of the signal line 20 on the negative side in the x-axis direction is positioned approximately at the center of the connecting portion 18d-f. The signal line 20 as above is preferably made of, for example, a metal material primarily composed of silver or copper and having a low specific resistance.

The signal line 21 (second signal line) is a linear conductor provided in the dielectric element assembly 12, and more specifically, as shown in FIGS. 3, 4, and 6, the signal line 21 extends on the top surface of the dielectric sheet 18b, along the line portions 18b-c and 18b-d, the crossing portion 18b-e, and the connecting portions 18b-h and 18b-i. Accordingly, in the dielectric element assembly 12, the signal line 21 is positioned on the positive side in the z-axis direction relative to the signal line 20. Moreover, the signal lines 20 and 21, when viewed in a plan view in the z-axis direction, cross each other at the crossing portion 12e, as shown in FIG. 4. In addition, the signal line 21 is positioned approximately at the center in the width direction of each of the line portions 18b-c and 18b-d, the crossing portion 18b-e, and the connecting portions 18b-h and 18b-i. Further, the end of the signal line 21 on the positive side in the x-axis direction is positioned approximately at the center of the connecting portion 18b-i. The end of the signal line 21 on the negative side in the x-axis direction is positioned approximately at the center of the connecting portion 18b-h (not shown). The signal line 21 as above is preferably made of, for example, a metal material primarily composed of silver or copper and having a low specific resistance.

The ground conductor 22 (second ground conductor) is provided in the dielectric element assembly 12, as shown in FIGS. 2 through 6, and more specifically, the ground conductor 22 is positioned on the top surface of the dielectric sheet 18a. Accordingly, the ground conductor 22 is positioned on the positive side in the z-axis direction relative to the signal line 21. The ground conductor 22, when viewed in a plan view in the z-axis direction, has approximately the same shape as the dielectric element assembly 12, and is preferably made of, for example, a metal material mainly composed of silver or copper and having a low specific resistance.

Furthermore, as shown in FIGS. 2 through 6, the ground conductor 22 includes main conductors 22a to 22d, a crossing conductor 22e, and terminal conductors 22f to 22i (the terminal conductors 22f and 22h are not shown in the figures).

The main conductors 22a to 22d and the crossing conductor 22e are strip-shaped conductors extending along the top surfaces of the line portions 18a-a to 18a-d and the crossing portion 18a-e, respectively, and the main conductors 22a to 22d and the crossing conductor 22e, when viewed in a plan view in the z-axis direction, overlap with the signal lines 20 and 21. The main conductors 22a to 22d are connected at the crossing portion 18a-e.

The terminal conductor 22g is positioned on the top surface of the connecting portion 18a-g, and is connected to the end of the main conductor 22b that is located on the positive side in the x-axis direction, as shown in FIG. 5. The terminal conductor 22g is in the shape of a rectangular or substantially rectangular frame. The terminal conductor 22f is positioned on the top surface of the connecting portion 18a-f, and is connected to the end of the main conductor 22a that is located on the negative side in the x-axis direction. The terminal conductor 22f has the same or substantially the same structure as the terminal conductor 22g, and therefore, is not shown in the figure.

The terminal conductor 22i is positioned on the top surface of the connecting portion 18a-i, and is connected to the end of the main conductor 22d that is located on the positive side in the x-axis direction, as shown in FIG. 6. The terminal conductor 22i is in the shape of a rectangular or substantially rectangular frame. The terminal conductor 22h is positioned on the top surface of the connecting portion 18a-h, and is connected to the end of the main conductor 22c that is located on the negative side in the x-axis direction. The terminal conductor 22h has the same or substantially the same structure as the terminal conductor 22i, and therefore, is not shown in the figure.

Incidentally, the main conductors 22c and 22d of the ground conductor 22 include a plurality of openings 31 arranged along the signal line 21, as shown in FIGS. 3, 4, and 6. The opening 31 is shaped such that the dimension in the y-axis direction is greater at the center in the x-axis direction than at either end in the x-axis direction, as shown in FIG. 3. In the following description, a section of the opening 31 that is located at the center in the x-axis direction will be referred to as a "section a4", a section located on the positive side in the x-axis direction relative to the section a4 will be referred to as a "section a5", and a section located on the negative side in the x-axis direction relative to the section a4 will be referred to as a "section a6". The dimension of the opening 31 in the y-axis direction is greater in the section a4 than both in the section a5 and in the section a6. Accordingly, the opening 31 preferably has a cross-shape of a rectangle whose four corners have been cut away in the shape of smaller rectangles.

The openings 31, when viewed in a plan view in the z-axis direction, overlap with the signal line 21. Portions of the ground conductor 22 that are positioned between adjacent openings 31 will be referred to as "bridge portions 61". In this manner, the openings 31 and the bridge portions 61 are arranged so as to alternate with each other along the signal line 21. Accordingly, the signal line 21 overlaps alternatingly with the openings 31 and the bridge portions 61. The interval between adjacent bridge portions 61 is shorter than half the wavelength of a high-frequency signal to be transmitted through the signal line 21. Note that no openings are provided in the main conductors 22a and 22b. Accordingly, the main conductors 22a and 22b are solid conductors.

Furthermore, in the high-frequency transmission line 10, a section where the signal line 21 overlaps with the opening 31 will be referred to as a "section A3", and a section where the signal line 21 overlaps with the bridge portion 61 will be referred to as a "section A4". The width W1 of the signal line 21 in the section A3 is greater than the width W2 of the signal line 21 in the section A4, as shown in FIG. 3. More specifically, the width W1 of the signal line 21 at an area of overlap with the opening 31 is greater than the width W2 of the signal line 21 at an overlap with the bridge portion 61. In addition, the width W1 of the signal line 21 in the section A3 is greater than the width W3 of the signal line 21 at the crossing with the signal line 20 (see FIG. 4).

The ground conductor 24 (first ground conductor) is provided in the dielectric element assembly 12, as shown in FIGS. 2 through 6, and more specifically, the ground conductor 24 is positioned on the top surface of the dielectric sheet 18e. Accordingly, the ground conductor 24 is positioned on the negative side in the z-axis direction relative to the signal line 20. The ground conductor 24, when viewed in a plan view in the z-axis direction, has approximately the same shape as the dielectric element assembly 12, and is preferably made of, for example, a metal material primarily composed of silver or copper and having a low specific resistance.

Furthermore, as shown in FIGS. 2 through 6, the ground conductor 24 includes main conductors 24a to 24d, a crossing conductor 24e, and terminal conductors 24f to 24i (the terminal conductors 24f and 24h are not shown in the figures).

The main conductors 24a to 24d and the crossing conductor 24e are strip-shaped conductors extending along the top surfaces of the line portions 18e-a to 18e-d and the crossing portion 18e-e, respectively, and the main conductors 24a to 24d and the crossing conductor 24e, when viewed in a plan view in the z-axis direction, overlap with the signal lines 20 and 21. The main conductors 24a to 24d are connected at the crossing portion 18e-e.

The terminal conductor 24g is positioned on the top surface of the connecting portion 18e-g, and is connected to the end of the main conductor 24b that is located on the positive side in the x-axis direction, as shown in FIG. 5. The terminal conductor 24g is in the shape of a rectangular or substantially rectangular frame. The terminal conductor 24f is positioned on the top surface of the connecting portion 18e-f, and is connected to the end of the main conductor 24a that is located on the negative side in the x-axis direction. The terminal conductor 24f has the same or substantially same structure as the terminal conductor 24g, and therefore, is not shown in the figure.

The terminal conductor 24i is positioned on the top surface of the connecting portion 18e-i, and is connected to the end of the main conductor 24d that is located on the positive side in the x-axis direction, as shown in FIG. 6. The terminal conductor 24i is in the shape of a rectangular or substantially rectangular frame. The terminal conductor 24h is positioned on the top surface of the connecting portion 18e-h, and is connected to the end of the main conductor 24c that is located on the negative side in the x-axis direction. The terminal conductor 24h has the same or substantially the same structure as the terminal conductor 24i, and therefore, is not shown in the figure.

Incidentally, the main conductors 24a and 24b of the ground conductor 24 include a plurality of openings 30 arranged along the signal line 20, as shown in FIGS. 2, 4, and 5. The opening 30 is shaped such that the dimension in the y-axis direction is greater at the center in the x-axis direction than at either end in the x-axis direction, as shown in FIG. 2. In the following, a section of the opening 30 that is located at the center in the x-axis direction will be referred to as a "section a1", a section located on the positive side in the x-axis direction relative to the section a1 will be referred to as a "section a2", and a section located on the negative side in the x-axis direction relative to the section a1 will be referred to as a "section a3". The dimension of the opening 30 in the y-axis direction is greater in the section a1 than in both in the section a2 and in the section a3. Accordingly, the opening 30 preferably is cross-shaped of a rectangle whose four corners have been cut away in the shape of smaller rectangles.

The openings 30, when viewed in a plan view in the z-axis direction, overlap with the signal line 20. Portions of the ground conductor 24 that are positioned between adjacent openings 30 will be referred to as "bridge portions 60". In this manner, the openings 30 and the bridge portions 60 are arranged so as to alternate with each other along the signal line 20. Accordingly, the signal line 20 overlaps alternatingly with the openings 30 and the bridge portions 60. The interval between adjacent bridge portions 60 is shorter than half the wavelength of a high-frequency signal to be transmitted through the signal line 20. Note that no openings are provided in the main conductors 24c and 24d. Accordingly, the main conductors 24c and 24d are solid conductors.

Furthermore, in the high-frequency transmission line 10, a section where the opening 30 is provided will be referred to as a "section A1", and a section where the bridge portion 60 is provided will be referred to as a "section A2". The width W1 of the signal line 20 in the section A1 is greater than the width W2 of the signal line 20 in the section A2, as shown in FIG. 3. More specifically, the width W1 of the signal line 20 at an area of overlap with the opening 30 is greater than the width W2 of the signal line 20 at an overlap with the bridge portion 60. In addition, the width W1 of the signal line 20 in the section A1 is greater than the width W3 of the signal line 20 at the crossing with the signal line 21 (see FIG. 4).

As described above, no openings are provided in the main conductors 22a and 22b, and the openings 30 are provided in the main conductors 24a and 24b, so that the area of overlap of the ground conductor 24 with the signal line 20 is smaller than the area of overlap of the ground conductor 22 with the signal line 20.

Furthermore, no openings are provided in the main conductors 24c and 24d, and the openings 31 are provided in the main conductors 22c and 22d, so that the area of overlap of the ground conductor 22 with the signal line 21 is smaller than the area of overlap of the ground conductor 24 with the signal line 21.

Furthermore, the distance D1 between the signal line 20 and the ground conductor 22 in the z-axis direction is greater than the distance D2 between the signal line 20 and the ground conductor 24 in the z-axis direction, as shown in FIGS. 7 and 8. The distance D1 is approximately equal to the total thickness of the dielectric sheets 18a to 18c, and the distance D2 is equal or approximately equal to the thickness of the dielectric sheet 18d.

Furthermore, the distance D3 between the signal line 21 and the ground conductor 22 in the z-axis direction is less than the distance D4 between the signal line 21 and the ground conductor 24 in the z-axis direction, as shown in FIGS. 9 and 10. The distance D3 is approximately equal to the thickness of the dielectric sheet 18a, and the distance D4 is equal or approximately equal to the total thickness of the dielectric sheets 18b to 18d.

Furthermore, the distance D1 between the signal line 20 and the ground conductor 22 in the z-axis direction is equal or approximately equal to the distance D4 between the signal line 21 and the ground conductor 24 in the z-axis direction. Moreover, the distance D2 between the signal line 20 and the ground conductor 24 in the z-axis direction is equal or approximately equal to the distance D3 between the signal line 21 and the ground conductor 22 in the z-axis direction. More specifically, the distances D1 and D4 are preferably set at about 150 μm, and the distances D2 and D3 are preferably set at about 50 μm, for example.

On the basis of the foregoing, the characteristic impedance of the signal line 20 in the high-frequency transmission line 10 is primarily determined by the opposed areas of the signal line 20 and the ground conductor 22 and the distance therebetween, as well as by the relative permittivities of the dielectric sheets 18*a* to 18*e*. Therefore, in the case where the characteristic impedance of the signal line 20 is to be set to about 50Ω, for example, the characteristic impedance of the signal line 20 is preferably designed to become, for example, about 55Ω, slightly higher than about 50Ω, for example, because of the influence of the signal line 20 and the ground conductor 22. Moreover, the ground conductor 24 is shaped such that the characteristic impedance of the signal line 20 becomes about 50Ω, for example, because of the influence of the signal line 20 and the ground conductors 22 and 24. In this manner, the ground conductor 22 plays the role of a reference ground conductor for the signal line 20.

On the other hand, the ground conductor 24 is a ground conductor that also functions as a shield for the signal line 20. Moreover, the ground conductor 24 is preferably designed to make final adjustments such that the characteristic impedance of the signal line 20 is set to about 50Ω, for example, as described above. More specifically, the size of the opening 30, the width of the bridge portion 60, and other parameters, are particularly designed. In this manner, the ground conductor 24 functions as an auxiliary ground conductor for the signal line 20.

Furthermore, the characteristic impedance of the signal line 21 in the high-frequency transmission line 10 is primarily determined by the opposed areas of the signal line 21 and the ground conductor 24 and the distance therebetween, as well as by the relative permittivities of the dielectric sheets 18*a* to 18*e*. Therefore, in the case where the characteristic impedance of the signal line 21 is to be set to about 50Ω, for example, the characteristic impedance of the signal line 21 is preferably designed to become, for example, about 55Ω, slightly higher than about 50Ω, because of the influence of the signal line 21 and the ground conductor 24. Moreover, the ground conductor 22 is shaped such that the characteristic impedance of the signal line 21 becomes about 50Ω because of the influence of the signal line 21 and the ground conductors 22 and 24. In this manner, the ground conductor 24 functions as a reference ground conductor for the signal line 21.

On the other hand, the ground conductor 22 is a ground conductor that also functions a shield for the signal line 21. Moreover, the ground conductor 22 is preferably designed to make final adjustments such that the characteristic impedance of the signal line 21 is set to about 50Ω, for example, as described above. More specifically, the size of the opening 31, the width of the bridge portion 61, and other parameters, are particularly designed. In this manner, the ground conductor 22 functions as an auxiliary ground conductor for the signal line 21.

In this manner, the signal line 20 and the ground conductors 22 and 24 define a stripline structure. Similarly, the signal line 21 and the ground conductors 22 and 24 define a stripline structure. Moreover, when the stripline including the signal line 20 and the ground conductors 22 and 24 is rotated 180 degrees about the x-axis, it approximately coincides with the stripline including the signal line 21 and the ground conductors 22 and 24. That is, these striplines have the same or approximately the same structure.

In the high-frequency transmission line 10 configured as described above, the characteristic impedance of the signal line 20 repeatedly fluctuates between two adjacent bridge portions 60 so as to increase in the order: minimum value Z3, intermediate value Z2, and maximum value Z1 and thereafter, decrease in the order: maximum value Z1, intermediate value Z2, and minimum value Z3. More specifically, a large capacitance is created between the signal line 20 and the ground conductor 24 in the section A2 where the signal line 20 overlaps with the bridge portion 60. Accordingly, in the section A2, a capacitance (C) property is dominant in the characteristic impedance of the signal line 20. Therefore, in the section A2, the characteristic impedance of the signal line 20 is at the minimum value Z3.

Furthermore, in the signal line 20, the dimension of the opening 30 in the y-axis direction is at the maximum value in the section a1. As a result, a small capacitance is created between the signal line 20 and the ground conductor 24 in the section a1. Accordingly, in the section a1, an inductance (L) property is dominant in the characteristic impedance of the signal line 20. Therefore, in the section a1, the characteristic impedance of the signal line 20 is at the maximum value Z1.

Furthermore, in the signal line 20, the dimension of the opening 30 in the y-axis direction is less than the maximum value in both of the section a2 and the section a3. As a result, in the sections a2 and a3, a medium capacitance is created between the signal line 20 and the ground conductor 24. Accordingly, in the sections a2 and a3, both inductance (L) and capacitance (C) properties are dominant in the characteristic impedance of the signal line 20. Therefore, in the sections a2 and a3, the characteristic impedance of the signal line 20 is at the intermediate value Z2.

Here, the sections between adjacent bridge portions 60 are arranged in the order: A2, a3, a1, a2, and A2, from the negative side to the positive side in the x-axis direction. Accordingly, the characteristic impedance of the signal line 20 fluctuates between adjacent bridge portions 60 in the order: minimum value Z3, intermediate value Z2, maximum value Z1, intermediate value Z2, and minimum value Z3. Moreover, the bridge portions 60 and the openings 30 alternatingly overlap along the signal line 20. Therefore, the characteristic impedance of the signal line 20 increases and decreases cyclically. Note that the maximum value Z1 is preferably, for example, about 70Ω, the intermediate value Z2 is preferably, for example, about 55Ω, and the minimum value Z3 is preferably, for example, about 30Ω. Further, the high-frequency transmission line 10 is designed such that the average characteristic impedance of the entire signal line 20 is preferably about 50Ω, for example.

In the high-frequency transmission line 10 configured as described above, the characteristic impedance of the signal line 21 repeatedly fluctuates between two adjacent bridge portions 61 so as to increase in the order: minimum value Z3, intermediate value Z2, and maximum value Z1, and thereafter, decrease in the order: maximum value Z1, intermediate value Z2, and minimum value Z3. More specifically, a large capacitance is created between the signal line 21 and the ground conductor 22 in the section A4 where the signal line 21 overlaps with the bridge portion 61. Accordingly, in the section A4, a capacitance (C) property is dominant in the characteristic impedance of the signal line 21. Therefore, in the section A4, the characteristic impedance of the signal line 21 is at the minimum value Z3.

Furthermore, in the signal line 21, the dimension of the opening 31 in the y-axis direction is at the maximum value in the section a4. As a result, a small capacitance is created between the signal line 21 and the ground conductor 22 in the section a4. Accordingly, in the section a4, an inductance (L) property is dominant in the characteristic impedance of the signal line 21. Therefore, in the section a4, the characteristic impedance of the signal line 21 is at the maximum value Z1.

Furthermore, in the signal line 21, the dimension of the opening 31 in the y-axis direction is less than the maximum value in both of the section a5 and the section a6. As a result, in the sections a5 and a6, a medium capacitance is created between the signal line 21 and the ground conductor 22. Accordingly, in the sections a5 and a6, both inductance (L) and capacitance (C) properties are dominant in the characteristic impedance of the signal line 21. Therefore, in the sections a5 and a6, the characteristic impedance of the signal line 21 is at the intermediate value Z2.

Here, the sections between adjacent bridge portions 61 are arranged in the order: A4, a6, a4, a5, and A4, from the negative side to the positive side in the x-axis direction. Accordingly, the characteristic impedance of the signal line 21 fluctuates between adjacent bridge portions 61 in the order: minimum value Z3, intermediate value Z2, maximum value Z1, intermediate value Z2, and minimum value Z3. Moreover, the bridge portions 61 and the openings 31 alternatingly overlap along the signal line 21. Therefore, the characteristic impedance of the signal line 21 increases and decreases cyclically. Note that the maximum value Z1 is preferably, for example, abut 70Ω, the intermediate value Z2 is preferably, for example, about 55Ω, and the minimum value Z3 is preferably, for example, about 30Ω. Further, the high-frequency transmission line 10 is designed such that the average characteristic impedance of the entire signal line 21 is preferably about 50Ω, for example.

The intermediate ground conductor 27 is preferably rectangular or substantially rectangular shaped at the crossing portion 18c-e on the top surface of the dielectric sheet 18c, as shown in FIG. 4. Accordingly, the intermediate ground conductor 27, when viewed in a plan view in the z-axis direction, overlaps with the crossing of the signal lines 20 and 21, and further, the intermediate ground conductor 27 is positioned between the signal lines 20 and 21 in the z-axis direction. Note that the width W3 of each of the signal lines 20 and 21 at their overlapping portions with the intermediate ground conductor 27 is smaller than the width W1 of each of the signal lines 20 and 21 in both of the sections A1 and A3.

The external terminal 16b is preferably a rectangular or substantially rectangular conductor provided on the top surface of the connecting portion 18a-g and surrounded by the terminal conductor 22g, as shown in FIG. 5. The external terminal 16b, when viewed in a plan view in the z-axis direction, overlaps with the end of the signal line 20 that is located on the positive side in the x-axis direction. The external terminal 16b is preferably made of, for example, a metal material primarily composed of silver or copper and having a low specific resistance. In addition, the top surface of the external terminal 16b is preferably plated with gold, for example.

The external terminal 16a is preferably a rectangular or substantially rectangular conductor provided on the top surface of the connecting portion 18a-f and surrounded by the terminal conductor 22f. The external terminal 16a, when viewed in a plan view in the z-axis direction, overlaps with the end of the signal line 20 that is located on the negative side in the x-axis direction. The external terminal 16a has the same or substantially the same structure as the external terminal 16b, and therefore, is not shown in the figure.

The external terminal 16d is preferably a rectangular or substantially rectangular conductor provided on the top surface of the connecting portion 18a-i and surrounded by the terminal conductor 22i, as shown in FIG. 6. The external terminal 16d, when viewed in a plan view in the z-axis direction, overlaps with the end of the signal line 21 that is located on the positive side in the x-axis direction. The external terminal 16d is preferably made of, for example, a metal material primarily composed of silver or copper and having a low specific resistance. In addition, the top surface of the external terminal 16d is preferably plated with gold, for example.

The external terminal 16c is a rectangular conductor provided on the top surface of the connecting portion 18a-h and surrounded by the terminal conductor 22h. The external terminal 16c, when viewed in a plan view in the z-axis direction, overlaps with the end of the signal line 21 that is located on the negative side in the x-axis direction. The external terminal 16c has the same or substantially the same structure as the external terminal 16d, and therefore, is not shown in the figure.

The via-hole conductor b1 pierces through the connecting portion 18a-g of the dielectric sheet 18a in the z-axis direction. The via-hole conductor b2 pierces through the connecting portion 18b-g of the dielectric sheet 18b in the z-axis direction. The via-hole conductor b3 pierces through the connecting portion 18c-g of the dielectric sheet 18c in the z-axis direction. The via-hole conductors b1 to b3 are connected to one another, thereby defining a single via-hole conductor. Moreover, the end of the via-hole conductor b1 that is located on the positive side in the z-axis direction is connected to the external terminal 16b, and the end of the via-hole conductor b3 that is located on the negative side in the z-axis direction is connected to the end of the signal line 20 that is located on the positive side in the x-axis direction. As a result, the via-hole conductors b1 to b3 connect the external terminal 16b to the end of the signal line 20 that is located on the positive side in the x-axis direction.

Note that the external terminal 16a (not shown) is connected to the end of the signal line 20 that is located on the negative side in the x-axis direction by via-hole conductors. These via-hole conductors that connect the external terminal 16a (not shown) to the end of the signal line 20 that is located on the negative side in the x-axis direction are similar to the via-hole conductors b1 to b3, and therefore, are not shown in the figure.

The via-hole conductor b4 pierces through the connecting portion 18a-i of the dielectric sheet 18a in the z-axis direction. Moreover, the end of the via-hole conductor b4 that is located on the positive side in the z-axis direction is connected to the external terminal 16d, and the end of the via-hole conductor b4 that is located on the negative side in the z-axis direction is connected to the end of the signal line 21 that is located on the positive side in the x-axis direction. As a result, the via-hole conductor b4 connects the external terminal 16d to the end of the signal line 21 that is located on the positive side in the x-axis direction.

Note that the external terminal 16c (not shown) is connected to the end of the signal line 21 that is located on the negative side in the x-axis direction by a via-hole conductor. The via-hole conductor that connects the external terminal 16c (not shown) to the end of the signal line 21 that is located on the negative side in the x-axis direction is similar to the via-hole conductor b4, and therefore, is not shown in the figure.

The via-hole conductors B1 pierce through the line portions 18a-a and 18a-b of the dielectric sheet 18a in the z-axis direction, and, when viewed in a plan view in the z-axis direction, the via-hole conductors B1 are positioned on the positive side in the y-axis direction relative to the signal line 20, so as to be aligned in the x-axis direction. The via-hole conductors B2 pierce through the line portions 18b-a and 18b-b of the dielectric sheet 18b in the z-axis direction, and, when viewed in a plan view in the z-axis direction, the via-hole conductors B2 are positioned on the positive side in the y-axis direction relative to the signal line 20, so as to be aligned in the x-axis direction. The via-hole conductors B3 pierce through the line portions 18c-a and 18c-b of the dielectric sheet 18c in the z-axis direction, and, when viewed in a plan view in the z-axis direction, the via-hole conductors B3 are positioned on the positive side in the y-axis direction relative to the signal line 20, so as to be aligned in the x-axis direction. The via-hole conductors B4 pierce through the line portions 18d-a and 18d-b of the dielectric sheet 18d in the z-axis direction, and, when viewed in a plan view in the z-axis direction, the via-hole conductors B4 are positioned on the positive side in the y-axis direction relative to the signal line 20, so as to be aligned in the x-axis direction. The via-hole conductors B1 to B4 are connected to one another, such that each set defines a single via-hole conductor. The end of the via-hole conductor B1 that is located on the positive side in the z-axis direction is connected to the ground conductor 22, and the end of the via-hole conductor B4 that is located on the negative side in the z-axis direction is connected to the ground conductor 24. As a result, the via-hole conductors B1 to B4 connect the ground conductors 22 and 24.

The via-hole conductors B5 pierce through the line portions 18a-a and 18a-b of the dielectric sheet 18a in the z-axis direction, and, when viewed in a plan view in the z-axis direction, the via-hole conductors B5 are positioned on the negative side in the y-axis direction relative to the signal line 20, so as to be aligned in the x-axis direction. The via-hole conductors B6 pierce through the line portions 18b-a and 18b-b of the dielectric sheet 18b in the z-axis direction, and, when viewed in a plan view in the z-axis direction, the via-hole conductors B6 are positioned on the negative side in the y-axis direction relative to the signal line 20, so as to be aligned in the x-axis direction. The via-hole conductors B7 pierce through the line portions 18c-a and 18c-b of the dielectric sheet 18c in the z-axis direction, and, when viewed in a plan view in the z-axis direction, the via-hole conductors B7 are positioned on the negative side in the y-axis direction relative to the signal line 20, so as to be aligned in the x-axis direction. The via-hole conductors B8 pierce through the line portions 18d-a and 18d-b of the dielectric sheet 18d in the z-axis direction, and, when viewed in a plan view in the z-axis direction, the via-hole conductors B8 are positioned on the negative side in the y-axis direction relative to the signal line 20, so as to be aligned in the x-axis direction. The via-hole conductors B5 to B8 are connected to one another, such that each set defines a single via-hole conductor. The end of the via-hole conductor B5 that is located on the positive side in the z-axis direction is connected to the ground conductor 22, and the end of the via-hole conductor B8 that is located on the negative side in the z-axis direction is connected to the ground conductor 24. As a result, the via-hole conductors B5 to B8 connect the ground conductors 22 and 24.

The via-hole conductors B11 pierce through the line portions 18a-c and 18a-d of the dielectric sheet 18a in the z-axis direction, and, when viewed in a plan view in the z-axis direction, the via-hole conductors B11 are positioned on the positive side in the y-axis direction relative to the signal line 21, so as to be aligned in the x-axis direction. The via-hole conductors B12 pierce through the line portions 18b-c and 18b-d of the dielectric sheet 18b in the z-axis direction, and, when viewed in a plan view in the z-axis direction, the via-hole conductors B12 are positioned on the positive side in the y-axis direction relative to the signal line 21, so as to be aligned in the x-axis direction. The via-hole conductors B13 pierce through the line portions 18c-c and 18c-d of the dielectric sheet 18c in the z-axis direction, and, when viewed in a plan view in the z-axis direction, the via-hole conductors B13 are positioned on the positive side in the y-axis direction relative to the signal line 21, so as to be aligned in the x-axis direction. The via-hole conductors B14 pierce through the line portions 18d-c and 18d-d of the dielectric sheet 18d in the z-axis direction, and, when viewed in a plan view in the z-axis direction, the via-hole conductors B14 are positioned on the positive side in the y-axis direction relative to the signal line 21, so as to be aligned in the x-axis direction. The via-hole conductors B11 to B14 are connected to one another, such that each set defines a single via-hole conductor. The end of the via-hole conductor B11 that is located on the positive side in the z-axis direction is connected to the ground conductor 22, and the end of the via-hole conductor B14 that is located on the negative side in the z-axis direction is connected to the ground conductor 24. As a result, the via-hole conductors B11 to B14 connect the ground conductors 22 and 24. Note that in the sections of the line portions 12c and 12d that extend in the y-axis direction, the via-hole conductors B11 to B14, when viewed in a plan view in the z-axis direction, are positioned on the negative side in the x-axis direction relative to the signal line 21.

The via-hole conductors B15 pierce through the line portions 18a-c and 18a-d of the dielectric sheet 18a in the z-axis direction, and, when viewed in a plan view in the z-axis direction, the via-hole conductors B15 are positioned on the negative side in the y-axis direction relative to the signal line 21, so as to be aligned in the x-axis direction. The via-hole conductors B16 pierce through the line portions 18b-c and 18b-d of the dielectric sheet 18b in the z-axis direction, and, when viewed in a plan view in the z-axis direction, the via-hole conductors B16 are positioned on the negative side in the y-axis direction relative to the signal line 21, so as to be aligned in the x-axis direction. The via-hole conductors B17 pierce through the line portions 18c-c and 18c-d of the dielectric sheet 18c in the z-axis direction, and, when viewed in a plan view in the z-axis direction, the via-hole conductors B17 are positioned on the negative side in the y-axis direction relative to the signal line 21, so as to be aligned in the x-axis direction. The via-hole conductors B18 pierce through the line portions 18d-c and 18d-d of the dielectric sheet 18d in the z-axis direction, and, when viewed in a plan view in the z-axis direction, the via-hole conductors B18 are positioned on the negative side in the y-axis direction relative to the signal line 21, so as to be aligned in the x-axis direction. The via-hole conductors B15 to B18 are connected to one another, such that each set defines a single via-hole conductor. The end of the via-hole conductor B15 that is located on the positive side in the z-axis direction is connected to the ground conductor 22, and the end of the via-hole conductor B18 that is located on the negative side in the z-axis direction is connected to the ground conductor 24. As a result, the via-hole conductors B15 to B18 connect the ground conductors 22 and 24. Note that in the sections of the line portions 12c and 12d that extend in the y-axis direction, the via-hole conductors B15 to B18, when viewed in a plan view in the z-axis direction, are positioned on the positive side in the x-axis direction relative to the signal line 21.

The via-hole conductors B21 pierce through the crossing portion 18a-e of the dielectric sheet 18a in the z-axis direction. The via-hole conductors B22 pierce through the crossing portion 18b-e of the dielectric sheet 18b in the z-axis direction. The via-hole conductors B23 pierce through the crossing portion 18c-e of the dielectric sheet 18c in the z-axis direction. The via-hole conductors B24 pierce through the crossing portion 18d-e of the dielectric sheet 18d in the z-axis direction. The via-hole conductors B21 to B24 are connected to one another, such that each set defines a single via-hole conductor. The end of the via-hole conductor B21 that is located on the positive side in the z-axis direction is connected to the ground conductor 22, and the end of the via-hole conductor B24 that is located on the negative side in the z-axis direction is connected to the ground conductor 24. Moreover, the end of the via-hole conductor B22 that is located on the negative side in the z-axis direction and the end of the via-hole conductor B23 that is located on the positive side in the z-axis direction are connected to the intermediate ground conductor 27. As a result, the via-hole conductors B21 to B24 connect the ground conductors 22 and 24 and the intermediate ground conductor 27.

The via-hole conductors b1 to b4, B1 to B8, B11 to B18, and B21 to B24 are preferably made of, for example, a metal material primarily composed of silver or copper and having a low specific resistance. Note that through-holes with conductor layers provided on their inner circumferential surfaces by plating or other suitable method may be used in place of the via-hole conductors b1 to b4, B1 to B8, B11 to B18, and B21 to B24.

The protective layer 14 covers the entire or substantially the entire top surface of the dielectric sheet 18a. Accordingly, the ground conductor 22 is covered by the protective layer 14. The protective layer 14 is preferably made of, for example, a flexible resin, such as a resist material.

Furthermore, as shown in FIGS. 2 through 6, the protective layer 14 includes line portions 14a to 14d, a crossing portion 14e, and connecting portions 14f to 14i (the connecting portions 14f and 14h are not shown in the figures). The line portions 14a to 14d and the crossing portion 14e cover the entire or substantially the entire top surfaces of the line portions 18a-a, 18a-b, 18a-c, and 18a-d and the crossing portion 18a-e, respectively, thus covering the main conductors 22a to 22d and the crossing conductor 22e.

The connecting portion 14g is connected to the end of the line portion 14b that is located on the positive side in the x-axis direction, so as to cover the top surface of the connecting portion 18a-g. The connecting portion 14g includes rectangular or substantially rectangular openings Ha to Hd provided therein. The opening Ha is a rectangular or substantially rectangular opening positioned approximately at the center of the connecting portion 14g. The external terminal 16b is exposed to the outside from the opening Ha. The opening Hb is a rectangular or substantially rectangular opening positioned on the positive side in the y-axis direction relative to the opening Ha. The opening Hc is a rectangular or substantially rectangular opening positioned on the positive side in the x-axis direction relative to the opening Ha. The opening Hd is a rectangular or substantially rectangular opening positioned on the negative side in the y-axis direction relative to the opening Ha. The terminal portion 22g is exposed to the outside from the openings Hb to Hd, so that the exposed portions define external terminals. Note that the connecting portion 14f has the same or substantially the same structure as the connecting portion 14g, and therefore is not shown in the figure, and further, any description thereof will be omitted.

The connecting portion 14i is connected to the end of the line portion 14d that is located on the positive side in the x-axis direction, so as to cover the top surface of the connecting portion 18a-i. The connecting portion 14i preferably includes rectangular or substantially rectangular openings He to Hh provided therein. The opening He is a rectangular or substantially rectangular opening positioned approximately at the center of the connecting portion 14i. The external terminal 16d is exposed to the outside from the opening He. The opening Hf is a rectangular or substantially rectangular opening positioned on the positive side in the y-axis direction relative to the opening He. The opening Hg is a rectangular or substantially rectangular opening positioned on the positive side in the x-axis direction relative to the opening He. The opening Hh is a rectangular or substantially rectangular opening positioned on the negative side in the y-axis direction relative to the opening He. The terminal portion 22i is exposed to the outside from the openings Hf to Hh, so that the exposed portions define external terminals. Note that the connecting portion 14h has the same or substantially the same structure as the connecting portion 14i, and therefore is not shown in the figure, and further, any description thereof will be omitted.

The connectors 100a and 100b are mounted on the top surfaces of the connecting portions 12f and 12g, respectively, and are electrically connected to the signal line 20 and the ground conductors 22 and 24. The connectors 100c and 100d are mounted on the top surfaces of the connecting portions 12h and 12i, respectively, and are electrically connected to the signal line 21 and the ground conductors 22 and 24. The connectors 100a to 100d are configured in the same or substantially the same manner, and therefore, only the configuration of the connector 100b will be described below by way of example. FIG. 11 is an external oblique view of the connector 100b in the high-frequency transmission line 10. FIG. 12 is a cross-sectional structure view of the connector 100b in the high-frequency transmission line 10.

The connector 100b includes a connector body 102, external terminals 104 and 106, a center conductor 108, and an external conductor 110, as shown in FIGS. 1, 11, and 12. The connector body 102 includes a rectangular or substantially rectangular plate and a cylindrical portion coupled thereon, and is preferably made of, for example, an insulating material such as resin.

The external terminal 104 is positioned on the plate of the connector body 102 on the negative side in the z-axis direction, so as to face the external terminal 16b. The external terminal 106 is positioned on the plate of the connector body 102 on the negative side in the z-axis direction, so as to correspond to the portions of the terminal conductor 22g that are exposed from the openings Hb to Hd.

The center conductor 108 is positioned approximately at the center of the cylindrical portion of the connector body 102, and is connected to the external terminal 104. The center conductor 108 is a signal terminal to/from which a high-frequency signal is inputted/outputted. The external conductor 110 is positioned on the inner circumferential surface of the cylindrical portion of the connector body 102, and is connected to the external terminal 106. The external conductor 110 is a ground terminal to be kept at a ground potential.

The connector 100b configured as described above is mounted on the top surface of the connecting portion 12g, such that the external terminal 104 is connected to the external terminal 16b, and the external terminal 106 is connected to the terminal conductor 22g, as shown in FIGS. 11 and 12. As a result, the signal line 20 is electrically connected to the center conductor 108. In addition, the ground conductors 22 and 24 are electrically connected to the external conductor 110.

The high-frequency transmission line 10 is used in a manner as will be described below. FIG. 13 illustrates an electronic device 200 provided with the high-frequency transmission line 10 as viewed in a plan view in the y-axis direction. FIG. 14 illustrates the electronic device 200 provided with the high-frequency transmission line 10 as viewed in a plan view in the z-axis direction.

The electronic device 200 includes the high-frequency transmission line 10, circuit boards 202a and 202b, receptacles 204a to 204d (the receptacles 204b and 204c are not shown in the figures), a battery pack (metallic body) 206, a housing 210, and antennas 212a and 212b.

The housing 210 accommodates the high-frequency transmission line 10, the circuit boards 202a and 202b, the receptacles 204a to 204d, the battery pack 206, and the antennas 212a and 212b, as shown in FIGS. 13 and 14. The circuit board 202a includes, for example, a transmission or reception circuit provided thereon. The circuit board 202b includes, for example, a power circuit (a radio frequency integrated circuit: RFIC) provided thereon. The battery pack 206 is, for example, a lithium-ion secondary battery, and the surface thereof is wrapped by a metal cover. The circuit board 202a, the battery pack 206, and the circuit board 202b are arranged in this order, from the negative side to the positive side in the x-axis direction.

The antenna 212a is connected to the circuit board 202a and is adapted to transmit/receive high-frequency signals in 800 MHz and 1800 MHz bands. The antenna 212b is connected to the circuit board 202a and is adapted to receive GPS signals.

The receptacle 204a is provided on the principal surface of the circuit board 202a on the negative side in the z-axis direction, and connected to the antenna 212a via a wiring trace provided on the circuit board 202a. The receptacle 204a is connected to the connector 100a. The receptacle 204b (not shown) is provided on the principal surface of the circuit board 202b on the negative side in the z-axis direction, and connected to the power circuit provided on the circuit board 202b. The receptacle 204b is connected to the connector 100b. Accordingly, high-frequency signals transmitted/received by the antenna 212a are transmitted to the signal line 20.

The receptacle 204c (not shown) is provided on the principal surface of the circuit board 202a on the negative side in the z-axis direction, and connected to the antenna 212b via a wiring trace provided on the circuit board 202a. The receptacle 204c is connected to the connector 100c. The receptacle 204d is provided on the principal surface of the circuit board 202b on the negative side in the z-axis direction, and connected to the power circuit provided on the circuit board 202b. The receptacle 204d is connected to the connector 100d. Accordingly, high-frequency signals, which are GPS signals, transmitted/received by the antenna 212b are transmitted to the signal line 21.

Here, the top surface of the dielectric element assembly 12 (more precisely, the protective layer 14) is in contact with the battery pack 206. The dielectric element assembly 12 and the battery pack 206 are fixed by an adhesive or other suitable material.

A non-limiting example of a method for producing the high-frequency transmission line 10 will be described below with reference to FIGS. 1 through 6. While the following description focuses on one high-frequency transmission line 10 as an example, in actuality, large-sized dielectric sheets are laminated and cut, so that a plurality of high-frequency transmission lines 10 are produced at the same time.

Prepared first are dielectric sheets 18a to 18e made of a thermoplastic resin and having their entire top surfaces copper-foiled. The copper-foiled surfaces of the dielectric sheets 18a to 18e are smoothened, for example, by galvanization for rust prevention. The thickness of the copper foil is from about 10 μm to about 20 μm, for example.

Next, external terminals 16a to 16d and a ground conductor 22 are formed on the top surface of the dielectric sheet 18a by photolithography. Specifically, resists are printed on the copper foil on the top surface of the dielectric sheet 18a in the same or substantially the same shapes as the external terminals 16a to 16d and the ground conductor 22. Then, any portions of the copper foil that are not coated with the resists are removed by etching the copper foil. Thereafter, the resists are removed. In this manner, the external terminals 16a to 16d and the ground conductor 22 are formed on the top surface of the dielectric sheet 18a.

Next, a signal line 21 is formed on the top surface of the dielectric sheet 18b by photolithography. Further, an intermediate ground conductor 27 is formed on the top surface of the dielectric sheet 18c by photolithography. Still further, a signal line 20 is formed on the top surface of the dielectric sheet 18d by photolithography. Yet further, a ground conductor 24 is formed on the top surface of the dielectric sheet 18e by photolithography. The signal lines 20 and 21, the ground conductor 24, and the intermediate ground conductor 27 are formed in the same or substantially the same manner as the external terminals 16a to 16d and the ground conductor 22, and therefore, any descriptions about their formation steps will be omitted.

Next, via-holes are bored through the dielectric sheets 18a to 18d by irradiating the bottom surfaces thereof with laser beams where via-hole conductors b1 to b4, B1 to B8, B11 to B18, and B21 to B24 are to be formed. Thereafter, the via-holes provided in the dielectric sheets 18a to 18d are filled with a conductive paste.

Next, the dielectric sheets 18a to 18e are stacked in this order, from the positive side to the negative side in the z-axis direction. Then, the dielectric sheets 18a to 18e are heated and pressed from both the positive and negative sides in the z-axis direction, thus softening the dielectric sheets 18a to 18e so as to be bonded and integrated, while solidifying the conductive paste in the via-holes, so that the via-hole conductors b1 to b4, B1 to B8, B11 to B18, and B21 to B24 are formed. Note that the via-hole conductors b1 to b4, B1 to B8, B11 to B18, and B21 to B24 do not have to be obtained by filling via-holes completely with conductors, and may be obtained, for example, by forming conductors only along the inner circumferential surfaces of via-holes.

Next, a resin (resist) paste is applied to the top surface of the dielectric sheet 18a, thereby forming a protective layer 14.

Lastly, connectors 100a to 100d are mounted on connecting portions 12f to 12i, respectively, by soldering. By the foregoing process, a high-frequency transmission line 10 is completed.

The high-frequency transmission line 10 configured as described above is significantly reduced in thickness of the dielectric element assembly 12 at the crossing of the signal lines 20 and 21. More specifically, in the high-frequency transmission line 10, the area of overlap of the ground conductor 24 with the signal line 20 is smaller than the area of overlap of the ground conductor 22 with the signal line 20. Accordingly, there is much less capacitance created between the signal line 20 and the ground conductor 24 than between the signal line 20 and the ground conductor 22. Therefore, it is possible to dispose the signal line 20 and the ground conductor 24 close to each other without excessively increasing the capacitance created between the signal line 20 and the ground conductor 24. More specifically, the signal line 20 and the ground conductor 24 can be provided close to each other without causing the characteristic impedance of the signal line 20 to be excessively lower than a predetermined value (e.g., about 50Ω). Thus, it is possible to position the signal line 20 on the negative side in the z-axis direction relative to the center of the dielectric element assembly 12 in the z-axis direction.

Similarly, the area of overlap of the ground conductor 22 with the signal line 21 is smaller than the area of overlap of the ground conductor 24 with the signal line 21. Accordingly, there is much less capacitance created between the signal line 21 and the ground conductor 22 than between the signal line 21 and the ground conductor 24. Therefore, it is possible to dispose the signal line 21 and the ground conductor 22 close to each other without excessively increasing the capacitance created between the signal line 21 and the ground conductor 22. More specifically, the signal line 21 and the ground conductor 22 can be provided close to each other without causing the characteristic impedance of the signal line 21 to be excessively lower than a predetermined value (e.g., about 50Ω). Thus, it is possible to position the signal line 21 on the positive side in the z-axis direction relative to the center of the dielectric element assembly 12 in the z-axis direction.

In this manner, in the high-frequency transmission line 10, the signal lines 20 and 21 preferably are provided on the different dielectric sheets 18b and 18d. Therefore, the signal lines 20 and 21 cross each other within the dielectric element assembly 12. Thus, the high-frequency transmission line 10 enables the thickness of the dielectric element assembly 12 to be significantly reduced while crossing the signal lines 20 and 21.

Furthermore, the high-frequency transmission line 10 significantly reduces or prevents crosstalk between the signal lines 20 and 21. More specifically, the high-frequency transmission line 10 includes the intermediate ground conductor 27 provided between the signal lines 20 and 21 in the z-axis direction so as to overlap with the crossing of the signal lines 20 and 21. The intermediate ground conductor 27 is maintained at a ground potential. Accordingly, noise emitted from both of the signal lines 20 and 21 is absorbed into the intermediate ground conductor 27. As a result, crosstalk between the signal lines 20 and 21 is significantly reduced or prevented.

Furthermore, the high-frequency transmission line 10 is much thinner. More specifically, in the high-frequency transmission line 10, the signal line 20, when viewed in a plan view in the z-axis direction, does not overlap with the ground conductor 24 in the section A1. Accordingly, very little capacitance is created between the signal line 20 and the ground conductor 24. Therefore, even if the distance between the signal line 20 and the ground conductor 24 in the z-axis direction is reduced, the capacitance created between the signal line 20 and the ground conductor 24 does not become excessively large. As a result, the characteristic impedance of the signal line 20 is much less likely to deviate from a predetermined value (e.g., about 50Ω). Thus, it is possible to make the high-frequency transmission line 10 thinner while keeping the characteristic impedance of the signal line 20 at the predetermined value. Note that for the same reason, even if the distance between the signal line 21 and the ground conductor 22 in the z-axis direction is reduced, the capacitance created between the signal line 21 and the ground conductor 22 does not become excessively large. As a result, the characteristic impedance of the signal line 21 is much less likely to deviate from a predetermined value (e.g., about 50Ω). Thus, it is possible to make the high-frequency transmission line 10 thinner while keeping the characteristic impedance of the signal line 21 at the predetermined value. Reducing the thickness of the high-frequency transmission line 10 allows the high-frequency transmission line 10 to be bent more readily.

Furthermore, in the high-frequency transmission line 10, transmission loss in the signal line 20 is significantly reduced or prevented. More specifically, in the section A1, the signal line 20 overlaps with the opening 30, so that little capacitance is created between the signal line 20 and the ground conductor 24. Therefore, even if the width W1 of the signal line 20 in the section A1 is set to be greater than the width W2 of the signal line 20 in the section A2, the characteristic impedance of the signal line 20 is not excessively lower in the section A1 than in the section A2. As a result, the high-frequency transmission line 10 enables the resistance of the signal line 20 to be reduced while keeping the characteristic impedance of the signal line 20 at a predetermined value. Thus, the high-frequency transmission line 10 significantly reduces or prevents transmission loss in the signal line 20. Note that for the same reason, transmission loss in the signal line 21 is also significantly reduced or prevented.

Furthermore, the high-frequency transmission line 10 enables the frequency of spurious radiation from the signal line 20 to be kept outside the frequency band for surrounding circuit boards, etc. More specifically, in the high-frequency transmission line 10, the openings 30 are arranged along the signal line 20. Accordingly, the characteristic impedance of the signal line 20 is higher in the section A1 where the signal line 20 overlaps with the opening 30, than in the section A2 where the signal line 20 overlaps with the bridge portion 60. Since the openings 30 and the bridge portions 60 alternatingly overlap with the signal line 20, the characteristic impedance of the signal line 20 fluctuates cyclically. In such a case, a standing wave occurs between two adjacent sections A1, resulting in spurious radiation. Therefore, by setting the interval between adjacent openings 30 to less than or equal to half the wavelength of a high-frequency signal to be used by the electronic device 200, it is possible to keep the frequency of spurious radiation from the signal line 20 outside the frequency band for high-frequency signals to be used by circuit boards, and other suitable components, in the electronic device 200.

Furthermore, in the high-frequency transmission line 10, the dimension of the opening 30 in the y-axis direction is greater in the section a1 than in both of the section a2 and the section a3. Accordingly, the distance between the signal line 20 and the ground conductor 24 is greater in the section a1 than in the sections a2 and a3. Moreover, the signal line 20 and the bridge portion 60 overlap with each other in the section A2. Accordingly, the distance between the signal line 20 and the ground conductor 24 is greater in the sections a2 and a3 than in the section A2. Therefore, in the section between adjacent bridge portions 60, the distance between the signal line 20 and the ground conductor 24 increases gradually, and thereafter, decreases gradually, from the negative side to the positive side in the x-axis direction.

Here, the characteristic impedance of the signal line 20 increases with the distance between the signal line 20 and the ground conductor 24. Accordingly, in the section between adjacent bridge portions 60, the characteristic impedance of the signal line 20 increases gradually, and thereafter, decreases gradually, from the negative side to the positive side in the x-axis direction. As a result, the characteristic impedance is prevented from sharply changing at the boundaries of the sections a1 to a3 and A2. Therefore, reflection of a high-frequency signal at the boundaries of the sections a1 to a3 and A2 is significantly reduced or prevented, so that the occurrence of a standing wave in the signal line 20 is minimized or prevented. Thus, in the high-frequency transmission line 10, spurious radiation from the signal line 20 is reduced. Note that for the same reason, spurious radiation from the signal line 21 is also significantly reduced or prevented.

Furthermore, in the high-frequency transmission line 10, the openings 30 are provided in the ground conductor 24, so that the characteristic impedance of the signal line 20 fluctuates cyclically. Therefore, when the high-frequency transmission line 10 is bent, the characteristic impedance of the signal line 20 changes to a smaller degree as compared to a high-frequency transmission line in which the characteristic impedance of a signal line is constant. Here, the high-frequency transmission line in which the characteristic impedance of a signal line is constant is intended to mean a high-frequency transmission line including, for example, either a solid ground conductor or aground conductor with a slit-shaped opening.

Furthermore, in the high-frequency transmission line 10, the openings 31 are provided in the ground conductor 22, so that the characteristic impedance of the signal line 21 fluctuates cyclically. Therefore, when the high-frequency transmission line 10 is bent, the characteristic impedance of the signal line 21 changes to a smaller degree as compared to a high-frequency transmission line in which the characteristic impedance of a signal line is constant.

Furthermore, the high-frequency transmission line 10 makes it possible to prevent the characteristic impedance of the signal line 20 from changing from a predetermined value. More specifically, the top surface of the dielectric element assembly 12 (more precisely, the protective layer 14) is in contact with the battery pack 206. In addition, the dielectric element assembly 12 and the battery pack 206 are fixed by an adhesive or other suitable material. Therefore, the ground conductor 22 in a solid form free of openings is positioned between the signal line 20 and the battery pack 206. As a result, a capacitance is prevented from being created between the signal line 20 and the battery pack 206. Thus, the characteristic impedance of the signal line 20 is prevented from changing from the predetermined value.

First Modification

Figure 15:
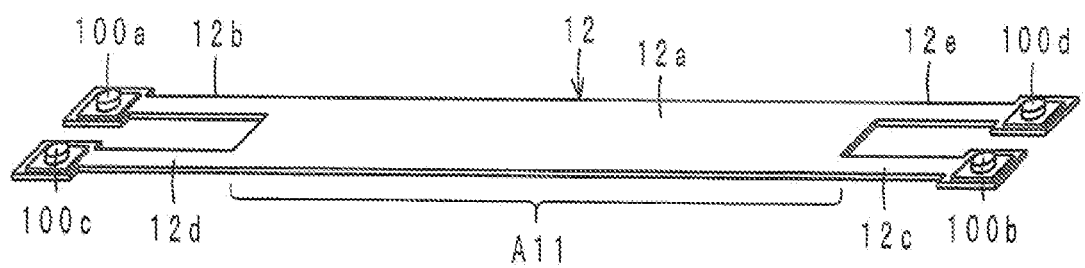
FIG. 15 is an external oblique view of a high-frequency transmission line according to a first modification of a preferred embodiment of the present invention.
Figure 17:
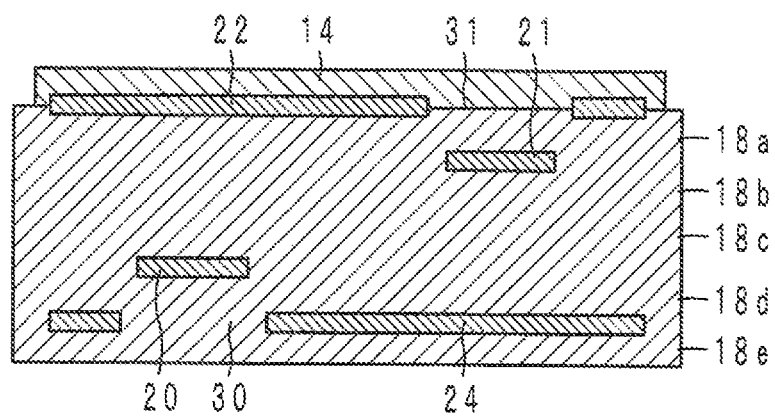
FIG. 17 is a cross-sectional structure view of the crossing section of the high-frequency transmission line according to the first modification of a preferred embodiment of the present invention.

Hereinafter, a high-frequency transmission line 10a according to a first modification of a preferred embodiment of the present invention will be described with reference to the drawings. FIG. 15 is an external oblique view of the high-frequency transmission line 10a according to the first modification. FIG. 16 is an exploded oblique view of a section A11 of the high-frequency transmission line 10a according to the first modification. FIG. 17 is a cross-sectional structure view of the section A11 of the high-frequency transmission line 10a according to the first modification.

The dielectric element assembly 12 extends in the x-axis direction and is divided into two branches at the end on each of the positive and negative sides in the x-axis direction, as shown in FIG. 15. The dielectric element assembly 12 is a flexible laminate preferably formed by laminating the protective layer 14 and the dielectric sheets 18a to 18e in this order from the positive side to the negative side in the z-axis direction, as shown in FIG. 16. In the following, the principal surface of the dielectric element assembly 12 that is located on the positive side in the z-axis direction will be referred to as a top surface, and the principal surface of the dielectric element assembly 12 that is located on the negative side in the z-axis direction will be referred to as a bottom surface.

The dielectric sheets 18a to 18e, when viewed in a plan view in the z-axis direction, have the same or substantially the same shape as the dielectric element assembly 12. The dielectric sheets 18a to 18e are preferably made of a flexible thermoplastic resin such as liquid crystal polymer or polyimide, for example. Each of the dielectric sheets 18a to 18e preferably has a thickness of, for example, about 25 µm to about 200 µm after lamination. In the following description, the principal surface of each of the dielectric sheets 18a to 18e that is located on the positive side in the z-axis direction will be referred to as a top surface, and the principal surface of each of the dielectric sheets 18a to 18e that is located on the negative side in the z-axis direction will be referred to as a bottom surface.

The signal line 20 is provided in the dielectric element assembly 12, more specifically, on the top surface of the dielectric sheet 18d, as shown in FIGS. 16 and 17. The signal line 20 is preferably made of, for example, a metal material primarily composed of silver or copper and having a low specific resistance.

The signal line 21 is provided in the dielectric element assembly 12 and positioned on the positive side in the z-axis direction relative to the signal line 20, more specifically, on the top surface of the dielectric sheet 18b, as shown in FIGS. 16 and 17. In the section A11, the signal line 21, when viewed in a plan view in the z-axis direction, extends at least partially along the signal line 20. The signal line 21, when viewed in a plan view in the z-axis direction, crosses the signal line 20 approximately at the center of the section A11 in the x-axis direction.

The ground conductor 22 is provided in the dielectric element assembly 12 and positioned on the positive side in the z-axis direction relative to the signal line 21, more specifically, on the top surface of the dielectric sheet 18a, as shown in FIGS. 16 and 17. The ground conductor 22, when viewed in a plan view in the z-axis direction, has approximately the same shape as the dielectric element assembly 12, and overlaps with the signal lines 20 and 21. The ground conductor 22 is preferably made of, for example, a metal material primarily composed of silver or copper and having a low specific resistance.

Here, the ground conductor 22 includes a plurality of rectangular or substantially rectangular openings 31 provided therein, as shown in FIG. 16. The openings 31, when viewed in a plan view in the z-axis direction, overlap with the signal line 21, and are arranged along the signal line 21.

Furthermore, the ground conductor 22 has a mesh structure provided as a mesh conductor 22j where the signal lines 20 and 21 cross each other when viewed in a plan view in the z-axis direction. The mesh structure refers to a network structure including, for example, a plurality of linear conductors that extend in the x-axis direction and a plurality of linear conductors that extend in the y-axis direction.

The ground conductor 24 is provided in the dielectric element assembly 12 and positioned on the negative side in the z-axis direction relative to the signal line 20, more specifically, on the top surface of the dielectric sheet 18e, as shown in FIGS. 16 and 17. The ground conductor 24, when viewed in a plan view in the z-axis direction, has approximately the same shape as the dielectric element assembly 12, and overlaps with the signal lines 20 and 21. The ground conductor 24 is preferably made of, for example, a metal material primarily composed of silver or copper and having a low specific resistance.

Here, the ground conductor 24 includes a plurality of rectangular or substantially rectangular openings 30 provided therein, as shown in FIG. 16. The openings 30, when viewed in a plan view in the z-axis direction, overlap with the signal line 20, and are arranged along the signal line 20.

Further, the ground conductor 24 preferably has a mesh structure provided as a mesh conductor 24j where the signal lines 20 and 21 cross each other when viewed in a plan view in the z-axis direction.

Moreover, the high-frequency transmission line 10a further includes an intermediate ground conductor 27. The intermediate ground conductor 27, when viewed in a plan view in the z-axis direction, overlaps with the crossing of the signal lines 20 and 21, and is positioned between the signal lines 20 and 21 in the z-axis direction. More specifically, the intermediate ground conductor 27 is positioned on the top surface of the dielectric sheet 18c. The intermediate ground conductor 27 is connected to the ground conductors 22 and 24 by via-hole conductors.

The protective layer 14 covers the entire or substantially the entire top surface of the dielectric sheet 18a. Accordingly, the ground conductor 22 is covered by the protective layer 14. The protective layer 14 is preferably made of, for example, a flexible resin such as a resist material.

The other features of the high-frequency transmission line 10a are the same or substantially the same as the high-frequency transmission line 10, and therefore, any descriptions thereof will be omitted.

Figure 18:
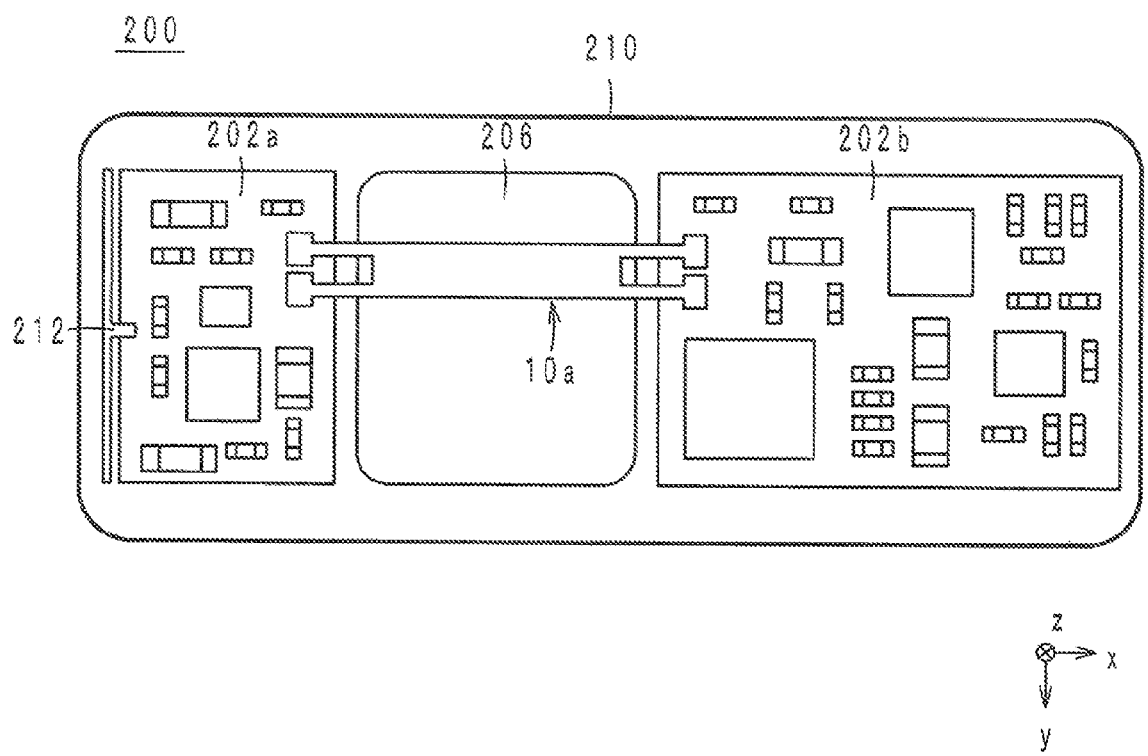
FIG. 18 illustrates an electronic device provided with the high-frequency transmission line as viewed in a plan view in the z-axis direction.

The high-frequency transmission line 10a is preferably used in a manner as will be described below. FIG. 18 illustrates an electronic device 200 provided with the high-frequency transmission line 10a as viewed in a plan view in the z-axis direction.

The electronic device 200 includes the high-frequency transmission line 10a, circuit boards 202a and 202b, a battery pack (metallic body) 206, a housing 210, and an antenna 212.

The housing 210 accommodates the high-frequency transmission line 10a, the circuit boards 202a and 202b, the battery pack 206, and the antenna 212, as shown in FIG. 18. The circuit board 202a includes, for example, a transmission or reception circuit provided thereon. The circuit board 202b includes, for example, a power circuit (a radio frequency integrated circuit: RFIC) provided thereon. The battery pack 206 is, for example, a lithium-ion secondary battery, and the surface thereof is wrapped by a metal cover. The circuit board 202a, the battery pack 206, and the circuit board 202b are arranged in this order, from the negative side to the positive side in the x-axis direction. Moreover, the antenna 212 is connected to the circuit board 202a.

The high-frequency transmission line 10a connects the circuit boards 202a and 202b. Moreover, the top surface of the dielectric element assembly 12 (more precisely, the protective layer 14) is in contact with the battery pack 206. The battery pack 206 is fixed on the top surface of the dielectric element assembly 12 by an adhesive or other suitable material.

The high-frequency transmission line 10a configured as described above achieves the same or substantially the same effects and advantages as those achieved by the high-frequency transmission line 10. Moreover, the high-frequency transmission line 10a has a mesh structure provided as the mesh conductor 22j where the signal lines 20 and 21 cross each other when viewed in a plan view in the z-axis direction. As a result, the capacitance created between the ground conductor 22 and the signal line 21 is significantly reduced or prevented. Therefore, even when the width of the signal line 21 is increased, the capacitance created between the ground conductor 22 and the signal line 21 does not become excessively large. Thus, it is possible to reduce the resistance of the signal line 21 by increasing the width of the signal line 21. Further, for the same reason, the resistance of the signal line 20 is significantly reduced or prevented.

Second Modification

Figure 19:
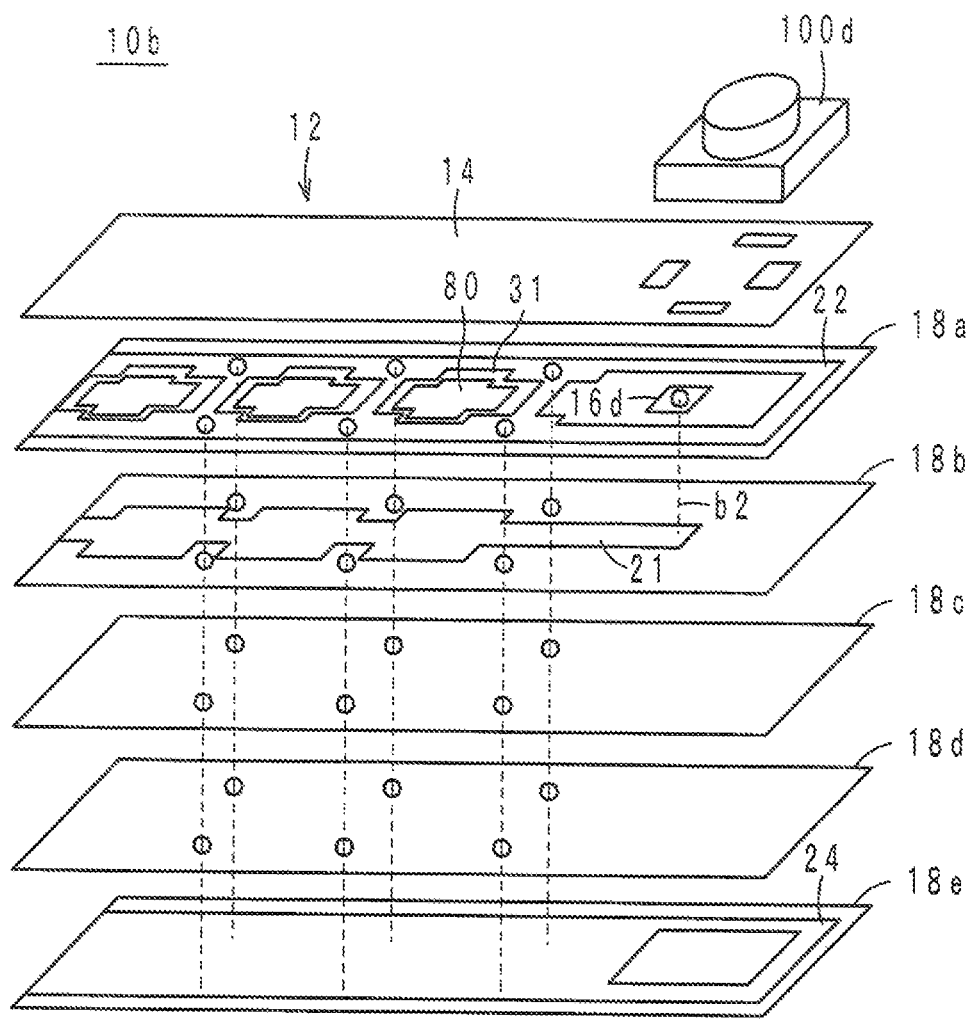
FIG. 19 is an exploded oblique view of a connecting portion of a high-frequency transmission line according to a second modification of a preferred embodiment of the present invention.

Hereinafter, a high-frequency transmission line 10b according to a second modification of a preferred embodiment of the present invention will be described with reference to the drawings. FIG. 19 is an exploded oblique view of a connecting portion 12i of the high-frequency transmission line 10b according to the second modification. For an external oblique view of the high-frequency transmission line 10b, FIG. 14 will be referenced.

The high-frequency transmission line 10b differs from the high-frequency transmission line 10a in that a floating conductor 80 is provided in the opening 31. More specifically, the floating conductor 80 is provided on the top surface of the dielectric sheet 18a so as to be positioned in the opening 31. The floating conductor 80 is not connected to either the signal lines 20 and 21 (the signal line 20 is not shown) or the ground conductors 22 and 24, and is maintained at a floating potential. The floating potential is a potential ranging between the potential of the signal lines 20 and 21 (the signal line 20 is not shown) and the ground potential.

Furthermore, the high-frequency transmission line 10b is bonded to the battery pack 206 such that the protective layer 14 contacts the battery pack 206. As a result, the ground conductor 22 is directed toward the battery pack 206. However, the floating conductors 80 are provided in the openings 31 of the ground conductor 22, so that the signal line 21 is prevented from facing the battery pack 206 through the openings 31. Therefore, the signal line 21 and the battery pack 206 are prevented from being capacitively coupled through the openings 31. Thus, the characteristic impedance of the signal line 21 is inhibited from fluctuating.

The present invention is not limited to the high-frequency transmission lines 10, 10a, and 10b according to the above-described preferred embodiments, and variations can be made within the spirit and scope of the present invention.

Further, the configuration of the high-frequency transmission lines 10, 10a, and 10b may be used in combination.

Note that the electronic device 200 is not limited to mobile communication terminals, such as cell phones, tablet computers, and notebook computers, and encompasses any device including a signal line for high-frequency signal transmission, such as digital cameras and desktop computers.

Further, the high-frequency transmission lines 10, 10a, and 10b may be used to connect matching circuits for high-frequency signals, rather than to connect antennas and power circuits. In addition, each of the high-frequency transmission lines 10, 10a, and 10b may be used to connect two high-frequency circuit boards.

Still further, through-hole conductors obtained by plating inner circumferential surfaces of through-holes may be used in the high-frequency transmission lines 10, 10a, and 10b in place of the via-hole conductors as described above.

Still further, in the high-frequency transmission lines 10, 10a, and 10b, the ground conductors 22 and 24 are provided in the dielectric element assembly 12, but they may be provided either on the top surface or the bottom surface of the dielectric element assembly 12.

Still further, the distance between the signal lines 20 and 21 in the z-axis direction may be greater at their crossing than where they do not cross. That is, the signal lines 20 and do not have to be positioned in their entireties on the dielectric sheets 18b and 18d.

Note that the high-frequency transmission lines 10, 10a, and 10b may be used on RF circuit boards, such as antenna top end modules.

Further, the connectors 100a to 100d do not have to be mounted on the high-frequency transmission lines 10, 10a, and 10b. In such a case, the high-frequency transmission lines 10, 10a, and 10b are connected at the ends to circuit boards by soldering or other suitable connection method. Alternatively, the connectors 100a to 100d may be mounted on some ends of the high-frequency transmission lines 10, 10a, and 10b.

Still further, the connectors 100a to 100d are mounted on the top surfaces of the high-frequency transmission lines 10, 10a, and 10b, but they may be provided on the bottom surfaces. Alternatively, the connectors 100a and 100b may be mounted on the top surfaces of the high-frequency transmission lines 10, 10a, and 10b, and the connector 100c and 100d may be mounted on the bottom surface of the high-frequency transmission line 10.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
    a housing; and
    a high-frequency transmission line accommodated in the housing; wherein,
    the high-frequency transmission line includes:
        a laminate including a plurality of dielectric layers;
        a first signal line provided in the laminate;
        a second signal line provided in the laminate and positioned on a first side in a direction of lamination relative to the first signal line, so as to cross the first signal line when viewed in a plan view in the direction of lamination;
        a first ground conductor positioned on a second side in the direction of lamination relative to the first signal line;
        a second ground conductor positioned on the first side in the direction of lamination relative to the second signal line; and
        an intermediate ground conductor provided between the first and second signal lines in the direction of lamination, so as to overlap with crossing portions of the first and second lines when viewed in a plan view in the direction of lamination; wherein
        an area of overlap of the first ground conductor with the first signal line is smaller than an area of overlap of the second ground conductor with the first signal line; and
        an area of overlap of the second ground conductor with the second signal line is smaller than an area of overlap of the first ground conductor with the second signal line.

2. The electronic device according to claim 1, wherein a distance between the first signal line and the first ground conductor in the direction of lamination is equal or approximately equal to a distance between the second signal line and the second ground conductor in the direction of lamination.

3. The electronic device according to claim 1, wherein the first ground conductor has a mesh structure provided at an overlap portion with the crossing portion of the first and second signal lines when viewed in a plan view in the direction of lamination.

4. The electronic device according to claim 1, wherein the laminate includes a protective layer provided on an outer surface thereof so as to cover an entire or substantially an entire outer surface.

5. The electronic device according to claim 1, wherein
    the first ground conductor includes a plurality of first openings arranged along the first signal line; and
    the second ground conductor includes a plurality of second openings arranged along the second signal line.

6. The electronic device according to claim 5, wherein the first signal line is wider at an overlap portion with the first openings than at the crossing portion with the second signal line.

7. The electronic device according to claim 5, wherein
    each of the plurality of first openings has a dimension extending in a direction perpendicular or substantially perpendicular to a longitudinal direction of the first ground conductor that is greater in a central portion than in end portions of each of the plurality of first openings; and
    each of the plurality of second openings have a dimension extending in a direction perpendicular or substantially perpendicular to a longitudinal direction of the second ground conductor that is greater in a central portion than in end portions of each of the plurality of first openings.

8. The electronic device according to claim 5, wherein each of the plurality of first openings and the plurality of second openings has a cross shape.

9. The electronic device according to claim 5, further comprising a floating conductor disposed in at least one of the plurality of first openings and the plurality of second openings.

10. A high-frequency transmission line comprising:
    a laminate including a plurality of dielectric layers;
    a first signal line provided in the laminate;
    a second signal line provided in the laminate and positioned on a first side in a direction of lamination of the plurality of dielectric layers relative to the first signal line, so as to cross the first signal line when viewed in a plan view in the direction of lamination;
    a first ground conductor positioned on a second side in the direction of lamination relative to the first signal line;
    a second ground conductor positioned on the first side in the direction of lamination relative to the second signal line; and
    an intermediate ground conductor provided between the first and second signal lines in the direction of lamination, so as to overlap with crossing portions of the first and second lines when viewed in a plan view in the direction of lamination; wherein
    an area of overlap of the first ground conductor with the first signal line is smaller than an area of overlap of the second ground conductor with the first signal line; and
    an area of overlap of the second ground conductor with the second signal line is smaller than an area of overlap of the first ground conductor with the second signal line.

11. The high-frequency transmission line according to claim 10, wherein a distance between the first signal line and the first ground conductor in the direction of lamination is equal or approximately equal to a distance between the second signal line and the second ground conductor in the direction of lamination.

12. The high-frequency transmission line according to claim 10, wherein the first ground conductor has a mesh structure provided at an overlap portion with the crossing portion of the first and second signal lines when viewed in a plan view in the direction of lamination.

13. The high-frequency transmission line according to claim 10, wherein the laminate includes a protective layer provided on an outer surface thereof so as to cover an entire or substantially an entire outer surface.

14. The high-frequency transmission line according to claim 10, wherein
the first ground conductor includes a plurality of first openings arranged along the first signal line; and
the second ground conductor includes a plurality of second openings arranged along the second signal line.

15. The high-frequency transmission line according to claim 14, wherein the first signal line is wider at an overlap portion with the first openings than at the crossing portion with the second signal line.

16. The high-frequency transmission line according to claim 14, wherein
each of the plurality of first openings has a dimension extending in a direction perpendicular or substantially perpendicular to a longitudinal direction of the first ground conductor that is greater in a central portion than in end portions of each of the plurality of first openings; and
each of the plurality of second openings has a dimension extending in a direction perpendicular or substantially perpendicular to a longitudinal direction of the second ground conductor that is greater in a central portion than in end portions of each of the plurality of first openings.

17. The high-frequency transmission line according to claim 14, wherein each of the plurality of first openings and the plurality of second openings has a cross shape.

18. The high-frequency transmission line according to claim 14, further comprising a floating conductor disposed in at least one of the plurality of first openings and the plurality of second openings.

* * * * *